(12) United States Patent
Sutardja et al.

(10) Patent No.: US 7,411,377 B2
(45) Date of Patent: Aug. 12, 2008

(54) ADAPTIVE CONTROL LOOP

(75) Inventors: Sehat Sutardja, Los Altos Hills, CA (US); Runsheng He, Sunnyvale, CA (US); Jiancheng Zhang, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 11/187,761

(22) Filed: Oct. 11, 2005

(65) Prior Publication Data

US 2006/0022657 A1 Feb. 2, 2006

Related U.S. Application Data

(62) Division of application No. 10/827,634, filed on Apr. 19, 2004, which is a division of application No. 10/460,825, filed on Jun. 12, 2003, now Pat. No. 6,977,492.

(60) Provisional application No. 60/395,697, filed on Jul. 12, 2002, provisional application No. 60/395,115, filed on Jul. 10, 2002.

(51) Int. Cl.
*G05F 1/40* (2006.01)
*H02M 7/10* (2006.01)

(52) U.S. Cl. .................................................. 323/282

(58) Field of Classification Search ................ 323/265, 323/268, 271, 282–288
See application file for complete search history.

(56) References Cited

U.S. PATENT DOCUMENTS

| 4,323,958 A | 4/1982 | Nowell |
| 4,803,440 A | 2/1989 | Hotta et al. |
| 4,884,183 A | 11/1989 | Sable |
| 4,902,958 A * | 2/1990 | Cook, II ...................... 323/282 |
| 5,121,413 A | 6/1992 | Voegtly et al. |
| 5,146,155 A | 9/1992 | Trinh Van et al. |
| 5,239,273 A | 8/1993 | Hedstrom et al. |
| 5,397,878 A | 3/1995 | Chen |
| 5,404,094 A * | 4/1995 | Green et al. ................. 323/282 |
| 5,479,089 A | 12/1995 | Lee |
| 5,486,752 A | 1/1996 | Hua et al. |

(Continued)

FOREIGN PATENT DOCUMENTS

CN 1198267 A 11/1998

(Continued)

OTHER PUBLICATIONS

U.S. Appl. No. 60/395,115, filed Jul. 10, 2002, Sutardja et al.

(Continued)

*Primary Examiner*—Matthew V. Nguyen

(57) ABSTRACT

A duty cycle estimator determines a duty cycle for controlling a regulated output of an output regulator. The output regulator is responsive to the duty cycle for controlling a transfer of energy between an input source and the regulated output. An error generator compares the regulated output to an output reference to generate an output error. An accumulator determines an accumulated error of the output error over a time period of at least N times a switching period of the output regulator, where N is an integer. A reference generator generates reference levels. A comparator compares the accumulated error to the reference levels such that a single zero is generated, and generates the duty cycle based on the comparing.

27 Claims, 26 Drawing Sheets

U.S. PATENT DOCUMENTS

| | | | |
|---|---|---|---|
| 5,563,779 A | 10/1996 | Cave et al. | |
| 5,566,063 A | 10/1996 | Gerster et al. | |
| 5,612,580 A | 3/1997 | Janonis et al. | |
| 5,867,384 A | 2/1999 | Drees et al. | |
| 5,883,501 A | 3/1999 | Arakawa et al. | |
| 5,929,619 A | 7/1999 | Chin et al. | |
| 5,939,871 A | 8/1999 | Tanaka | |
| 5,949,226 A | 9/1999 | Tanaka et al. | |
| 5,969,515 A | 10/1999 | Oglesbee | |
| 5,998,982 A | 12/1999 | Groeneveld et al. | |
| 6,020,729 A | 2/2000 | Stratakos et al. | |
| 6,078,170 A * | 6/2000 | Sudo | 323/282 |
| 6,100,676 A | 8/2000 | Burstein et al. | |
| 6,115,266 A | 9/2000 | Maeyama et al. | |
| 6,166,990 A | 12/2000 | Ooishi et al. | |
| 6,191,567 B1 | 2/2001 | Sluijs | |
| 6,194,883 B1 | 2/2001 | Shimamori | |
| 6,215,288 B1 | 4/2001 | Ramsey et al. | |
| 6,232,754 B1 | 5/2001 | Liebler et al. | |
| 6,268,716 B1 | 7/2001 | Burstein et al. | |
| 6,281,668 B1 * | 8/2001 | Sudo | 323/299 |
| 6,297,623 B1 | 10/2001 | Balakrishnan et al. | |
| 6,304,067 B1 | 10/2001 | Wrathall | |
| 6,307,356 B1 | 10/2001 | Dwelley | |
| 6,329,801 B1 | 12/2001 | Zuniga et al. | |
| 6,366,070 B1 | 4/2002 | Cooke et al. | |
| 6,370,039 B1 * | 4/2002 | Telefus | 363/15 |
| 6,396,718 B1 | 5/2002 | Ng et al. | |
| 6,445,169 B1 | 9/2002 | Schultz et al. | |
| 6,472,918 B1 * | 10/2002 | Mosinskis et al. | 327/175 |
| 6,515,882 B2 | 2/2003 | Moriguchi et al. | |
| 6,555,994 B1 | 4/2003 | Keane et al. | |
| 6,557,066 B1 | 4/2003 | Crafts et al. | |
| 6,583,608 B2 | 6/2003 | Zafarana et al. | |
| 6,590,369 B2 | 7/2003 | Burstein et al. | |
| 6,661,210 B2 | 12/2003 | Kimball et al. | |
| 6,661,285 B1 | 12/2003 | Pompei et al. | |
| 6,680,604 B2 | 1/2004 | Muratov et al. | |
| 6,713,995 B2 | 3/2004 | Chen | |
| 6,791,305 B2 | 9/2004 | Imai et al. | |
| 6,853,173 B2 | 2/2005 | Caine et al. | |
| 6,870,353 B2 | 3/2005 | Inaba | |
| 6,873,140 B2 | 3/2005 | Saggini et al. | |
| 6,894,465 B2 | 5/2005 | Sutardja et al. | |
| 6,894,910 B1 * | 5/2005 | Wu | 363/79 |
| 6,906,503 B2 | 6/2005 | Lopez-Santillana et al. | |
| 6,909,266 B2 * | 6/2005 | Kernahan et al. | 323/282 |
| 7,268,527 B2 | 9/2007 | Horner | |
| 2002/0074975 A | 6/1999 | Culpepper | |
| 2001/0036085 A1 | 11/2001 | Yuki | |
| 2002/0031001 A1 | 3/2002 | Harvest | |
| 2002/0057080 A1 | 5/2002 | Telefus et al. | |
| 2002/0084809 A1 | 7/2002 | Okuno et al. | |
| 2002/0105767 A1 | 8/2002 | Schuellein et al. | |
| 2004/0008016 A1 | 1/2004 | Sutardja et al. | |
| 2004/0155640 A1 | 8/2004 | Sutardja et al. | |
| 2004/0178785 A1 | 9/2004 | Sutardja et al. | |
| 2004/0196015 A1 | 10/2004 | Sutardja et al. | |
| 2004/0196016 A1 | 10/2004 | Sutardja et al. | |
| 2004/0196017 A1 | 10/2004 | Sutardja et al. | |
| 2004/0196018 A1 | 10/2004 | Sutardja et al. | |
| 2004/0239300 A1 | 12/2004 | Sutardja et al. | |
| 2007/0085520 A1 | 4/2007 | Ho | |

FOREIGN PATENT DOCUMENTS

| | | |
|---|---|---|
| EP | 0 524 398 A | 1/1993 |
| EP | 1 179 884 A | 2/2002 |
| JP | 9-215319 | 0/1997 |
| JP | 02-106168 | 4/1990 |
| JP | 11-89222 | 3/1999 |
| JP | 11-146301 | 5/1999 |
| JP | 11-187646 | 7/1999 |
| JP | 11-289574 | 10/1999 |
| JP | 2002-32745 | 1/2000 |
| JP | 2001-298949 | 10/2001 |
| JP | 2002-64975 | 2/2002 |
| JP | 2002-78320 | 3/2002 |
| JP | 2002-84742 | 3/2002 |
| JP | 2002-084743 | 3/2002 |
| JP | 2002-095243 | 3/2002 |
| JP | 2002-153050 | 5/2002 |
| JP | 2002-165442 | 6/2002 |
| JP | 2005-533471 | 11/2005 |
| JP | 2006-42597 | 2/2006 |
| WO | WO 97/50165 | 12/1997 |
| WO | WO 02/19507 | 3/2002 |
| WO | WO 02/31951 | 4/2002 |
| WO | WO 02/31951 A2 | 4/2002 |
| WO | WO 03/001314 A | 1/2003 |
| WO | WO 2004/006037 | 1/2004 |

OTHER PUBLICATIONS

U.S. Appl. No. 60/395,697, filed Jul. 12, 2002, Sutardja et al.

Bob Mammano, "Current Sensing Solutions for Power Supply Designers", Power Supply Design Seminar, Unitrode, 1997, pp. 1-35.

FAN5094, "Multi-Slice Interleaved Buck Converter", Fairchild Semiconductor, Preliminary Information, Jan. 10, 2002, pp. 1-22.

HIP6301, "Microprocessor CORE Voltage Regulator Multi-Phase Buck PWM Controller", Data Sheet, Intersil, Mar. 2000, pp. 1-16.

Communication for International Search Report for PCT Application No. PCT/US03/21542, filed Oct. 7, 2003.

"Review of On-Board Low Voltage/High Current DC-DC Converters for the New Generation of Microprocessors", by Abu Qahouq et al., 4th Jordanian International Electrical & Electronics Engineering Conference in Apr. 2001, 9 pages.

LM2639, "5-Bit Programmable, High Frequency Multi-phase PWM Controller", National Semiconductor, Feb. 2000, pp. 1-8.

TPS5211, "High Frequency Programmable Hysteretic Regulator Controller", Texas Instruments, Sep. 1999, pp. 1-31.

Communication dated Jul. 7, 2005 for the partial European Search Report Application No. EP 04023256.3-2206.

Communication dated Jul. 20, 2005 for the European Search Report Application No. 04023251.4-2206.

Communication dated Jul. 20, 2005 for the European Search Report Application No. 04023259.7-2206.

Communication dated Jun. 30, 2005 for the European Search Report Application No. 04023234.0-2206.

Communication dated Jun. 30, 2005 for the European Search Report Application No. 04023247.2-2206.

Communication dated Jun. 16, 2005 for the European Search Report Application No. 04023249.8-2206.

Communication dated Jul. 4, 2005 for the European Search Report Application No. 04023192.0-2206.

Peterchev A V et al: "Quantization resolution and limit cycling in digitally controlled PWM converters" 32nd Annual IEEE Power Electronics Specialists Conference. PESC 2001. Conference Proceedings. Vancouver, Canada, Jun. 17-21, 2001, Annual Power Electronics Specialists Conference, New York, NY: IEEE, US, vol. 1 of 4. Conf. 32, Jun. 17, 2001, pp. 465-471, XP010559271 ISBN: 0-7803-7067-8.

Communication from the European Patent Office dated Sep. 14, 2005 for Application No. 04023256.3-2206; 6 pages.

F. Briz, A. Diez, M.W. Degner; "Dynamic Operation of Carrier Signal Injection Based Sensorless, Direct Field Oriented AC Drives"; Industry Applications Conference, 1999; pp. 2313-2320.

Communication from the European Patent Office dated Apr. 20, 2005 for Application No. 04023258.9-2206; 3 pages.

Communication from the European Patent Office dated Apr. 20, 2005 for Application No. 04023257.1-2206; 3 pages.

Software Controlled Switched-Mode Power Supply Using DSP; Takaharu Takeshita, Akira Usui, and Nobuyuki Matsui; 2000; pp. 22-31.

Official Communication from the European Patent Office dated May 3, 2006 for Application No. 04 023 192.0 - 2206: 5 pages.

Official Communication from the European Patent Office dated May 5, 2006 for Application No. 04 023 249.8 - 2206; 6 pages.

Communication from the European Patent Office dated Aug. 21, 2006 sending the Search Report for Application No. 03763431.8 - 2206; 3 pages.

Xunwei Zhou et al; "Improve Light Load Efficiency for Synchronous Rectifier Buck Converter" 1999; pp. 295-302.

Communication from the European Patent Office dated Aug. 21, 2006 sending the Search Report for Application No. 03763431.8 - 2006; 3 pages.

Xunwei Zhou et al; "Improve Light Load Efficiency for Synchronous Rectifier Buck Converter" 1999; pp. 295-302.

Organized Translation of the Office Action from the Japanese Patent Office for Japanese Patent Application No. 2005-258592; 2 pages.

Organized Translation of the Office Action from the Japanese Patent Office for Japanese Patent Application No. 2005-258593; 2 pages.

Organized Translation of the Office Action from the Japanese Patent Office for Japanese Patent Application No. 2005-258594; 2 pages.

Oragnized Translation of the Office Action from the Japanese Patent Office for Japanese Patent Application No. 2005-258595; 2 pages.

Organized Translation of the Office Action from the Japanese Patent Office for Japanese Patent Application No. 2005-258596; 2 pages.

Organized Translation of the Office Action from the Japanese Patent Office for Japanese Patent Application No. 2005-258597; 2 pages.

Organized Translation of the Office Action from the Japanese Patent Office for Japanese Patent Application No. 2005-258598; 2 pages.

Organized Translation of the Office Action from the Japanese Patent Office for Japanese Patent Application No. 2005-258599; 2 pages.

Organized Translation of the Office Action from the Japanese Patent Office for Japanese Patent Application No. 2005-258600; 2 pages.

Organized Translation of the Office Action from the Japanese Patent Office for Japanese Patent Application No. 2004-520097; 2 pages.

Non-Final Notice of Reasons for Rejection from the Japanese Patent Office dated May 22, 2007 for Japanese Patent Application No. 2005-258593; 9 pages.

First Office Action from the State Intellectual Property Office of PRC dated May 11, 2007 for Chinese Divisional Patent Application No. 200410088918.2; 11 pages.

Peterchev et al; "Quantization Resolution and Limit Cycling in Digitally Controlled PWM Converters"; 2001 IEEE; pp. 465-471.

First Office Action from the State Intellectual Property Office of PRC dated Mar. 9, 2007 for Chinese Application No. 200410088924.8; 3 pages.

Official Communication from the EPO dated Jan. 31, 2007 for Application No. 04 023 251.4-2206; 4 pages.

Official Communication from the EPO dated Jan. 31, 2007 for Application No. 04 023 259.7-2206; 4 pages.

Official Communication from the EPO dated Jan. 31, 2007 for Application No. 04 023 258.9-2206; 5 pages.

Official Communication from the EPO dated Jan. 31, 2007 for Application No. 04 023 257.1-2206; 4 pages.

Official Communication from the EPO dated Jan. 31, 2007 for Application No. 04 023 256.3-2206; 4 pages.

Official Communication from the EPO dated Jan. 31, 2007 for Application No. 04 023 234.0-2206; 3 pages.

Official Communication from the EPO dated Feb.1, 2007 for Application No. 04 023 247.2-2206; 3 pages.

Official Communications from the EPO dated Jan. 31, 2007 for Application No. 04 023 249.8-2206; 3 pages.

Official Communication from the EPO dated Jan. 31, 2007 for Application No. 04 023 192.0-2206; 4 pages.

Notification of First Office Action from the State Intellectual Property Office of PRC dated Feb. 9, 2007 for Application No. 03805465.5; 10 pages.

Notification of First Office Action from the State Intellectual Property Office of PRC dated Feb. 9, 2007 for Application No. 200410088922.9; 12 pages.

Notification of First Office Action from the State Intellectual Property Office of PRC dated Mar. 9, 2007 for Application No. 200410088923.3; 10 pages.

Notification of First Office Action from the State Intellectual Property Office of PRC dated Feb. 9, 2007 for Application No. 200410088921.4; 12 pages.

Notification of First Office Action from the State Intellectual Property Office of PRC dated Mar. 2, 2007 for Application No. 200410088917.8; 8 pages.

Notification of First Office Action from the State Intellectual Property Office of PRC dated Mar. 9, 2007 for Application No. 200410088924.8; 6 pages.

Organized Translation of Notice of Reasons for Rejection from the Japanese Patent Office dated Sep. 11, 2007 for Japanese Application No. 2004-520097; 7 pages.

Organized Translation of Notice of Reasons for Rejection from the Japanese Patent Office dated Sep. 11, 2007 for Japanese Application No. 2005-258592; 13 pages.

Organized Translation of Notice of Reasons for Rejection from the Japanese Patent Office dated Sep. 11, 2007 for Japanese Application No. 2005-258594; 11 pages.

Organized Translation of Notice of Reasons for Rejection from the Japanese Patent Office dated Sep. 11, 2007 for Japanese Application No. 2005-258595; 21 pages.

Organized Translation of Notice of Reasons for Rejection from the Japanese Patent Office dated Sep. 11, 2007 for Japanese Application No. 2005-258596; 12 pages.

Organized Translation of Notice of Reasons for Rejection from the Japanese Patent Office dated Sep.11, 2007 for Japanese Application No. 2005-258597; 17 pages.

Organized Translation of Notice of Reasons for Rejection from the Japanese Patent Office dated Sep. 11, 2007 for Japanese Application No. 2005-258598; 13 pages.

Organized Translation of Notice of Reasons for Rejection from the Japanese Patent Office dated Sep. 11, 2007 for Japanese Application No. 2005-258599; 11 pages.

Organized Translation of Notice of Reasons for Rejection from the Japanese Patent Office dated Sep. 11, 2007 for Japanese Application No. 2005-258600; 17 pages.

Second Office Action from the Peoples Republic of China dated August 10, 2007 for Chinese Application No. 03805465.5; 6 pages.

First Office Action from the Peoples Republic of China dated Jul. 6, 2007 for Chinese Application No. 200410088920.X; 10 pages.

Second Office Action from the Peoples Republic of China dated Aug. 10, 2007 for Chinese Application No. 200410088923.3; 4 pages.

First Office Action from the Peoples Republic of China dated Aug. 3, 2007 for Chinese Application No. 200410088916.3; 6 pages.

Second Office Action from the Peoples Republic of China dated Sep. 14, 2007 for Chinese Application No. 200410088922.9; 9 pages.

First Office Action from the State Intellectual Property Office of PRC dated Mar. 9, 2007 for Chinese Application No. 200410088924.8; 6 pages.

First Office Action from the State Intellectual Property Office of PRC dated Mar. 2, 2007 for Chinese Application No. 200410088917.8; 8 pages.

First Office Action from the State Intellectual Property Office of PRC dated Feb. 9, 2007 for Chinese Application No. 038805465.5; 10 pages.

First Office Action from the State Intellectual Property Office of PRC dated Feb. 9, 2007 for Chinese Application No. 200410088922.9; 12 pages.

First Office Action from the State Intellectual Property Office of PRC dated Mar. 9, 2007 for Chinese Application No. 200410088923.3; 10 pages.

First Office Action from the State Intellectual Property Office of PRC dated Feb. 9, 2007 for Chinese Application No. 200410088921.4; 12 pages.

* cited by examiner

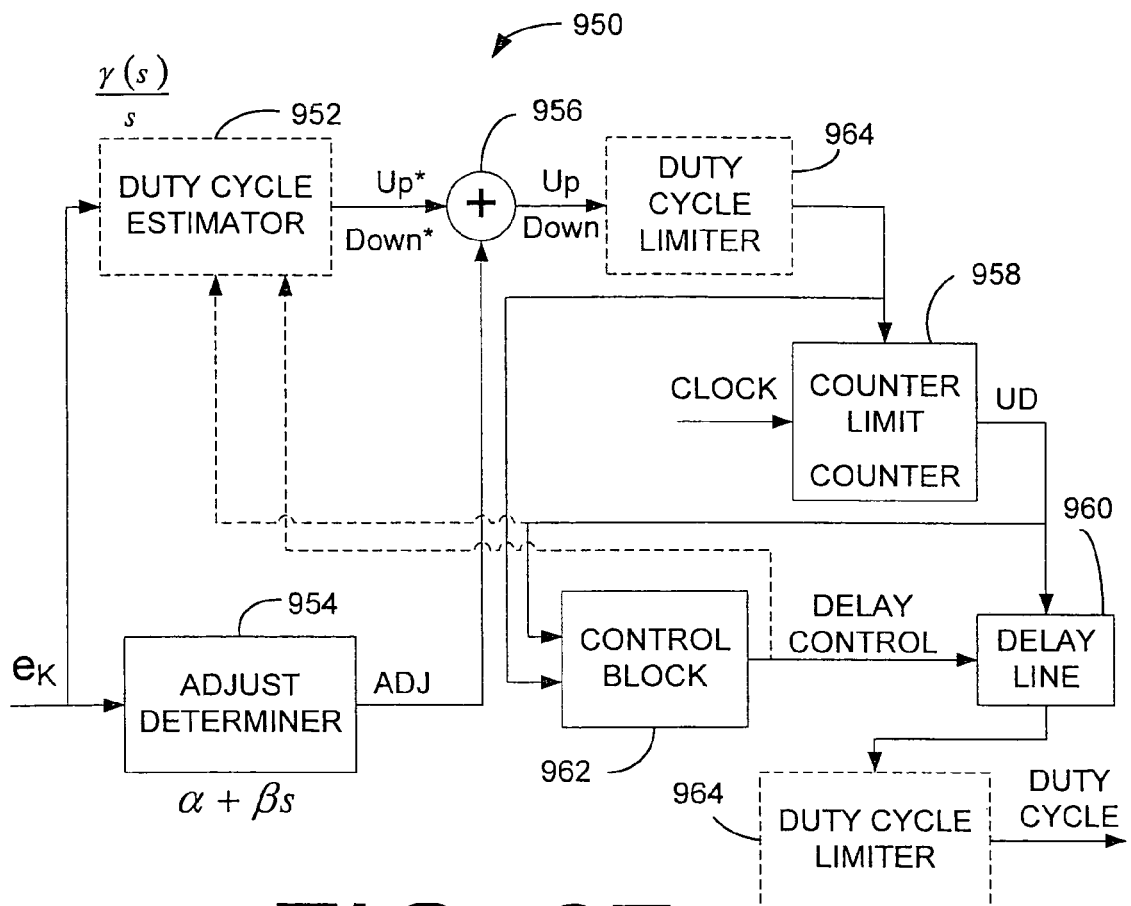
FIG. 27
+A3
+A2
+A1
Vref
-A1
-A2
-A3
FIG. 29
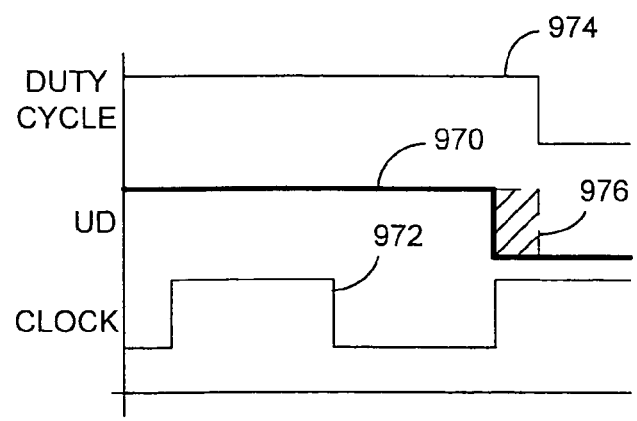
FIG. 30

ADAPTIVE CONTROL LOOP

CROSS-REFERENCE TO RELATED APPLICATIONS

This application is a divisional of application Ser. No. 10/827,634, filed Apr. 19, 2004, which is a divisional of application Ser. No. 10/460,825, filed Jun. 12, 2003 now U.S. Pat. No. 6,977,492, which claims the benefit of the filing date of U.S. provisional applications No. 60/395,115 filed Jul. 10, 2002, and 60/395,697 filed Jul. 12, 2002, the entire contents of which are herein incorporated by reference.

TECHNICAL FIELD

This invention relates to output regulators.

BACKGROUND

Output regulators are employed in numerous machines and devices including virtually every electronic device. An output regulator typically converts unregulated input power to one or more regulated outputs for supplying power to circuits within the machine or device. The regulated outputs are most commonly regulated voltage, but regulated current and regulated power may also be generated. The output regulator may be integrated into the machine or device, or the output regulator may be a separate assembly that is assembled to machine or device. Several characteristics of output regulators may be used to judge the quality of a particular design including operating characteristics such as power density, efficiency, output regulation, and transient response. Improvements in the operating characteristics of output regulators are desirable so that machines and devices that use output regulators may be improved such as by being made smaller, requiring less power, having improved accuracy and reliability, or having improved operation during transient conditions.

SUMMARY

In one aspect, a control system and method for controlling an output regulator having a regulated output. An output sensor to generate a digital sense signal to indicate within which of at least three reference ranges the regulated output is included. Each of the at least three reference ranges including a plurality of possible values of the regulated output. A digital controller, responsive to the digital sense signal, to generate a drive signal to control the regulated output.

In another aspect, an output regulator and method to convert an input voltage to a regulated output. The output regulator including a power stage to generate a power output from the input voltage. An output filter to filter the power output to generate the regulated output. An output sensor to generate a digital sense signal to indicate within which of at least three reference ranges the regulated output is included. Each of the at least three reference ranges including a plurality of possible values of the regulated output. A digital controller, responsive to the digital sense signal, to generate a drive signal to control the power stage.

In another aspect, a circuit and method for generating a feedback signal corresponding to a first voltage. The circuit comprising a reference generator to generate at least two reference voltages. The reference voltages to define at least three voltage ranges. A comparator to compare the first voltage to the at least three voltage ranges and to generate a digital signal to indicate within which of the at least three reference ranges the regulated output is included.

In another aspect, a control system and method to control an output regulator. The output regulator to convert an input voltage to a regulated output. The output regulator including a power stage to generate a power output from the input voltage and an output filter to filter the power output to generate the regulated output. The control system comprising a digital controller, responsive to a sense signal corresponding to the regulated output, to generate a drive signal to control the power stage. The digital controller including and selecting between at least three operating modes, a selected one of the operating modes to generate the drive signal.

In another aspect, a power array and method for converting an input voltage to a chopped output. An output regulator to convert the chopped output to a regulated output. The power array comprising a switch array, responsive to independent drive signals, to convert the input voltage to the chopped output at a switching frequency. The switch array including at least two power switches. A switch controller to generate the independent drive signals as a function of a duty cycle signal. The switch controller to operate at a sampling frequency, the sampling frequency being greater than the switching frequency. The switch controller to control the independent drive signals at a drive frequency greater than the switching frequency.

In another aspect, a method and system of sensing current in an output regulator, comprising providing a current sensor having a gain resolution, setting the current sensor gain resolution to an initial resolution, sensing a current flowing through the current sensor, evaluating an amplitude of the current, and at a sampling frequency, controlling the gain resolution of the current sensor based on the evaluating.

In another aspect, a method and system of controlling deadtime between power switches in an output regulator, comprising providing at least two power switches having a common node, wherein at least one of the two power switches is a conducting switch and a remainder of the two power switches is a free-wheeling switch. Switching one of the conducting switch and the free-wheeling switch from an on-state to an off-state. During a transition from the on-state to the off-state, monitoring a current flowing through one of the conducting switch and the free-wheeling switch. Comparing the current to a reference level. Delaying for a predetermined time period, then changing the operating state of the other of the conducting switch and the freewheeling switch from an off-state to an on-state.

In another aspect, a method and system of reducing switching losses in a switch array for an output regulator. The switch array to convert energy from an input source to a regulated output of the output regulator, the switch array including at least two power switches. The method comprising determining an expected current flowing through the switch array during a next switching cycle. At a sampling rate, determining expected power losses of the switch array based on the expected current. Determining a combination of the power switches to enable that minimizes the expected power losses. Enabling the combination of power switches.

In another aspect, a method and system of suppressing noise in a power stage for an output regulator. The power stage to convert energy from an input source to a regulated output of the output regulator. The power stage including at least two switch arrays having a common node. The method comprising monitoring a noise characteristic of the common node, comparing the noise characteristic to a reference level, generating an impedance control signal based on the comparing, and at a sampling rate controlling the switch arrays in response to the impedance control signal.

In another aspect, a method and system of controlling a capacitance of a circuit node of a power stage for an output regulator. The power stage to convert energy from an input source to a regulated output of the output regulator. The power stage including at least one switch array and a first power switch connected to the circuit node, the switch array including at least two series pairs of power switches. The method comprising monitoring a current flowing through the switch array, determining a desired capacitance at the circuit node based on the current, at a sampling rate determining a combination of switch assemblies to enable to set the circuit node to the desired capacitance, and controlling the series pairs of power switches to set the circuit node to the desired capacitance.

In another aspect, a diode emulation system and method to convert energy from an input source to a regulated output of an output regulator. The output regulator having a switching frequency. The diode emulation system comprising a first power switch, responsive to a first drive signal, to control a flow of energy from the input source to an output inductor of the output regulator such that a current flowing through the output inductor increases. A switch array including at least two power switches, responsive to array drive signals, to provide a path for the current flowing through output inductor during a freewheeling phase such that current flowing through the output inductor decreases. A current sensor to sense a current flowing through the switch array, and a controller to generate the array drive signals as a function of the current flowing through the switch array. The controller to independently control the at least two power switches.

In another aspect, a duty cycle limiter and method for limiting a transfer of energy between an input source and a regulated output of an output regulator. The output regulator having a regulator characteristic and a computed duty cycle for controlling the transfer of energy between the input source and the regulated output. The duty cycle limiter comprising a digital controller to generate a reference level and to compare the regulator characteristic of the output regulator to the reference level to determine a maximum duty cycle. The digital controller to control the reference level at a frequency at least equal to a switching frequency of the output regulator. The digital controller to limit the computed duty cycle to the maximum duty cycle.

In another aspect, a duty cycle estimator and method for determining a nominal duty cycle of an output regulator. The duty cycle estimator comprising at least two modes including a mode one estimator and a mode two estimator. The mode one estimator to determine the nominal duty cycle as a function of prior duty cycles. The mode two estimator to determine the nominal duty cycle as a function of accumulated error. A mode selector to, based on a mode selection criteria, select a one of the at least two modes to generate the nominal duty cycle.

In another aspect, a digital controller and method for controlling a regulated output of an output regulator. The output regulator responsive to a pulse width signal for controlling the transfer of energy between an input source and the regulated output. The digital controller comprising a duty cycle estimator to determine a nominal duty cycle. An adjust determiner to determine an adjustment value to combine with the nominal duty cycle to generate an adjusted dutycycle, the pulse width signal being a function of the adjusted duty cycle.

In another aspect, a duty cycle estimator and method for determining a duty cycle for controlling a regulated output of an output regulator. The output regulator responsive to the duty cycle for controlling the transfer of energy between an input source and the regulated output. The duty cycle estimator comprising an accumulator to determine an accumulated error over a time period greater than a switching period of the output regulator. A reference generator to generate reference levels. A comparator to compare the accumulated error to the reference levels at a maximum rate greater than the switching period such that a single zero is generated, and to generate the duty cycle based on the comparing.

In another aspect, a digital controller and method for controlling an output regulator. The digital controller having sub-blocks for providing functions to control the output regulator. The digital controller comprising an energy saving discontinuous mode (ESDM) controller to monitor a sense point of the output regulator. The sense point to indicate an output power state of the output regulator. The ESDM controller to control a flow of power to the sub-blocks to reduce power consumption of the digital controller during selected power states of the output regulator.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 6 is a graph of an output voltage during turn-on.

FIG. 27 is a block diagram of an aspect of a digital controller for a switching regulator.

FIG. 29 is a graphical diagram of voltage levels associated with an aspect of voltage slicer.

FIG. 30 is a timing diagram of waveforms associated with an aspect of digital controller for generating a duty cycle for a switching regulator.

Like reference symbols in the various drawings indicate like elements.

DETAILED DESCRIPTION

Figure 1:
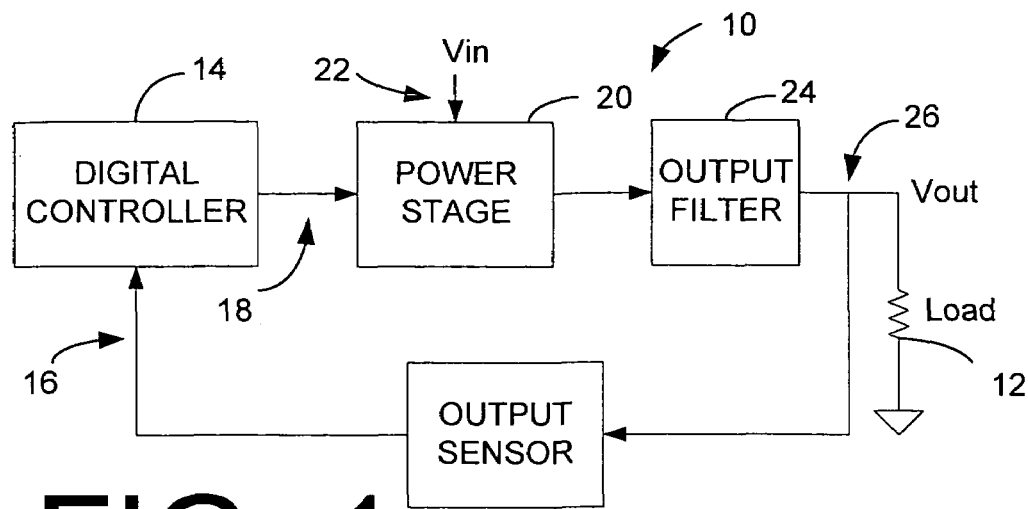
FIG. 1 is a block diagram of an aspect of an output regulator.

FIG. 1 shows a power regulator 10 for supplying regulated power to a load 12. The power regulator 10 may include a digital controller 14 to receive a feedback signal 16 and to generate one or more control signals 18 to drive a power stage 20. The power stage 20 converts an unregulated voltage, such as Vin 22, to a chopped waveform that is filtered by an output filter 24 to generate a regulated output 26. The regulated output 26 is preferably a direct current (DC) output and may be any output characteristic including voltage, current, and power. The unregulated voltage may be any form of input power such as alternating current (AC) voltage and DC voltage. For an AC input voltage a rectification stage (not shown) may be included to convert the AC voltage to the DC input voltage, Vin, 22. An output sensor 28 senses the regulated output 26 and sends the feedback signal to the digital controller 14. The power regulator 10 may employ any topology such as buck, boost, flyback (buck-boost), Cuk,.Sepic, and Zeta.

Figure 2:
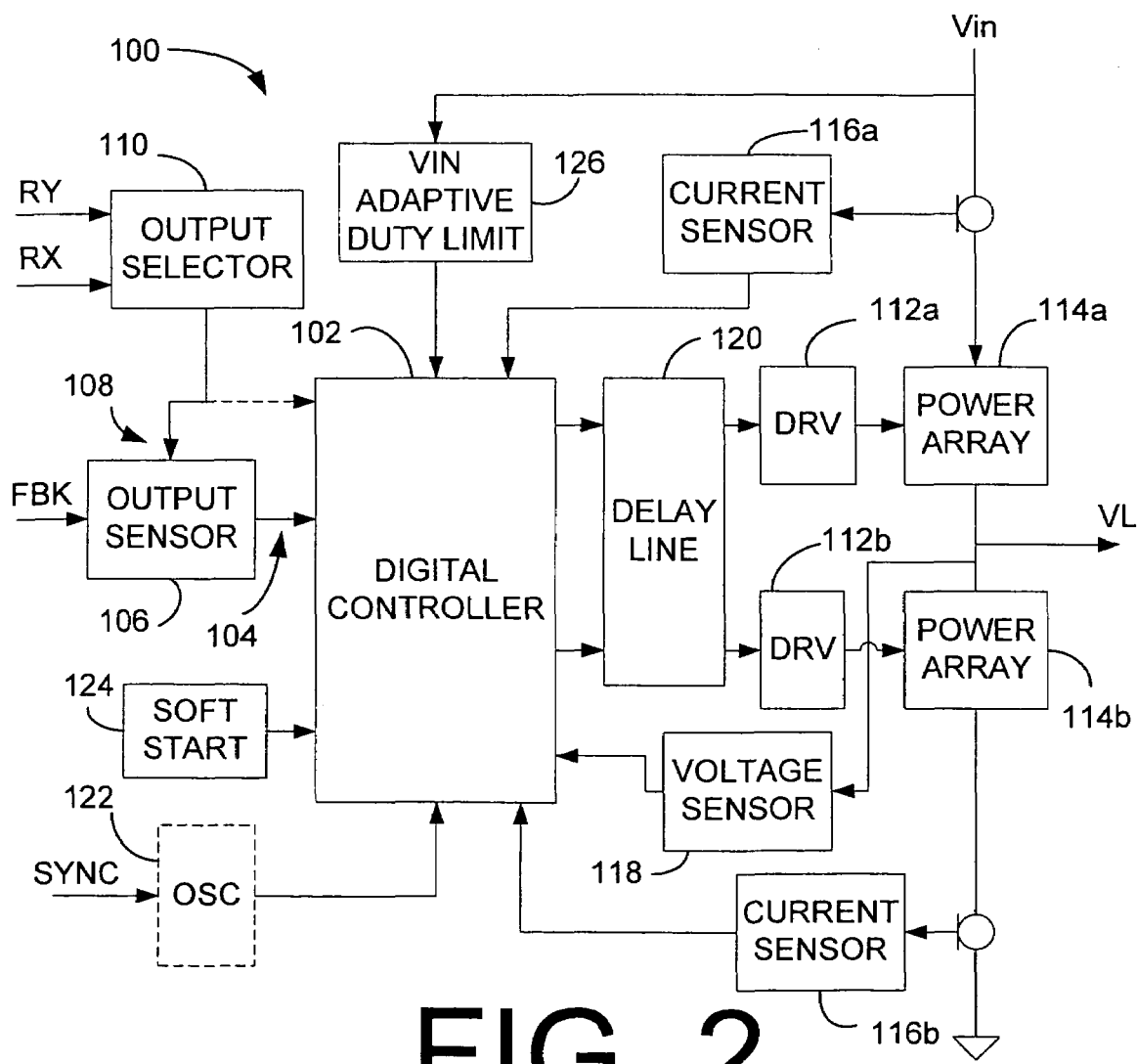
FIG. 2 is a block diagram of an aspect of a digital controller for an output regulator.

FIG. 2 shows a portion of a voltage converter 100 for converting an unregulated input voltage, Vin, to a regulated output for supplying power to a load (not shown). A digital controller 102 generates a pair of drive signals to control the conversion of Vin to a chopped waveform. The digital controller 102 may be implemented in any manner such as a programmable device executing software or firmware, digital circuitry, logic circuits, digital signal processors, and combinations of the preceding. The digital controller 102 generates the drive signals in response to a digital error signal 104 corresponding to the regulated output.

An output sensor 106 may sense the regulated output and generate the digital error signal 104. The output sensor 106 may compare the regulated output to a reference signal 108 to generate the digital error signal. The reference signal 108 may be any type of signal such as analog and digital and may be generated in any manner.

For example, an output selector 110 may generate the reference signal 108 in response to one or more inputs, Rx and Ry. The inputs may be resistors that connect to a reference voltage such as ground. The values of the resistors may correspond to the selection of an output voltage level and tolerance. The output selector 110 may be a separate module or be included within the digital controller 102.

Driver circuits 112a and 112b may buffer the drive signals from the digital controller 102 and generate signals to drive upper and lower power arrays 114a and 114b. The driver circuits 112a and 112b may have a lower output impedance to decrease the transition time when switching the power arrays 114a and 114b between operating states. Any type of driver may be employed for the driver circuits 112a and 112b.

The power arrays 114a and 114b each include one or more power switches operated in a switching mode, cycling between on and off states. Any type of power switch may be used such as MOSFETs, BJTs, IGBTs, and MCTs. The power arrays 114a and 114b may be configured in anyjtopology such as buck, boost, flyback, sepic, Cuk, and zeta.

Here, the power arrays 114a and 114b are described in a buck configuration. The upper power array 114a is connected between Vin and a common node, VL. The lower power array 114b is connected between VL and a lower voltage such as ground. As the power arrays 114a and 114b switch between on and off states Vin and ground are applied to VL. When Vin is applied to VL, energy flows from Vin through VL to an output filter (see FIG. 1).

Current sensors 116a and 116b may measure the current flowing through the power arrays 114a and 114b. The current sensors may employ any method of current sensing such as current transformers, series resistors, hall effect devices, and determining the current based on the voltage developed across a MOSFET in the on state. Each of the current sensors 116a and 116b may generate a digital output to indicate a current characteristic such as peak current, average current, and actual current. The digital output of the current may be one or more bits.

A voltage sensor 118 may sense the voltage at VL. The voltage sensor 118 may generate a digital output based on the sensed voltage. The digital output of VL may be 2 or more bits. The VL information may be used for control and protection such as indirectly sensing current through the lower power array 114b.

A delay line 120 may finetune the estimated duty cycle computed by the digital controller 102. The delay line 120 may generate a delay signal to lengthen the estimated duty cycle. For example, the estimated duty cycle may be computed as an integer multiple of a clock pulse width and the delay line 120 may vary the estimated duty cycle by increments that are less than the clock pulse width. The delay line 120 may receive a digital signal of one or more bits such as a multibit digital signal, and generate a pulse with a controlled pulse width. Any type of pulse stretching technique may be employed. In addition, the delay line 120 may include dithering to generate fractional increments. In an exemplary system, delay line 120 may generate a minimum increment resolution that is equal to "ti", and by applying dithering, the average of the generated pulse may be pulse stretched by any fractional portion of "ti". In one dithering method, a selected number of pulses within the continuing series of pulses may be stretched by an integer "N" number of increments, and the remaining pulses in the series of pulses may be stretched by an integer "N−1" or "N+1" number of increments to generate a pulse that is fractionally stretched.

An oscillator 122 may generate a clock signal for the voltage converter 100. The oscillator 122 may receive an external sync signal to synchronize the clock signal. Any type of oscillator may be used such as phase lock loop oscillators and crystal oscillators.

A soft start circuit 124 may generate a soft start signal to limit the transfer of energy to the output during turn-on of the power supply. The soft start signal may be a 5 bit signal that controls the pulse width of the drive signals to limit energy transfer to the output. For example, during turn-on, the soft start signal may ramp up in value limiting the maximum pulse width. Any type of soft start technique may be employed such as limiting the duty cycle, controlling the operating frequency of the drive signals, and controllably increasing the reference voltage that the output feedback signal is compared to gradually increase the output voltage to a steady-state level. The soft start circuit 124 may limit the transfer of energy on a cycle by cycle basis.

An adaptive duty limit 126 may generate a digital signal to limit the transfer of energy to the output as a function of an electrical characteristic of the input power such as Vin, the input current, Iin, the input ripple voltage, VINripple, the input power, Pin, the input source impedance, Rs, and the input energy, Qin. For example, the adaptive duty limit 126 may monitor Iin and generate a digital signal to limit the duty cycle so that the amplitude of Iin does not exceed a threshold value. The adaptive duty limit 126 may operate on a cycle-by-cycle basis to control the threshold value. Each cycle, the adaptive duty limit 126 may change the threshold value and limit the duty cycle for the next cycle. The duty cycle for the next cycle may be determined based on comparing the input power electrical characteristic of the previous cycle to the threshold value.

Figure 3:
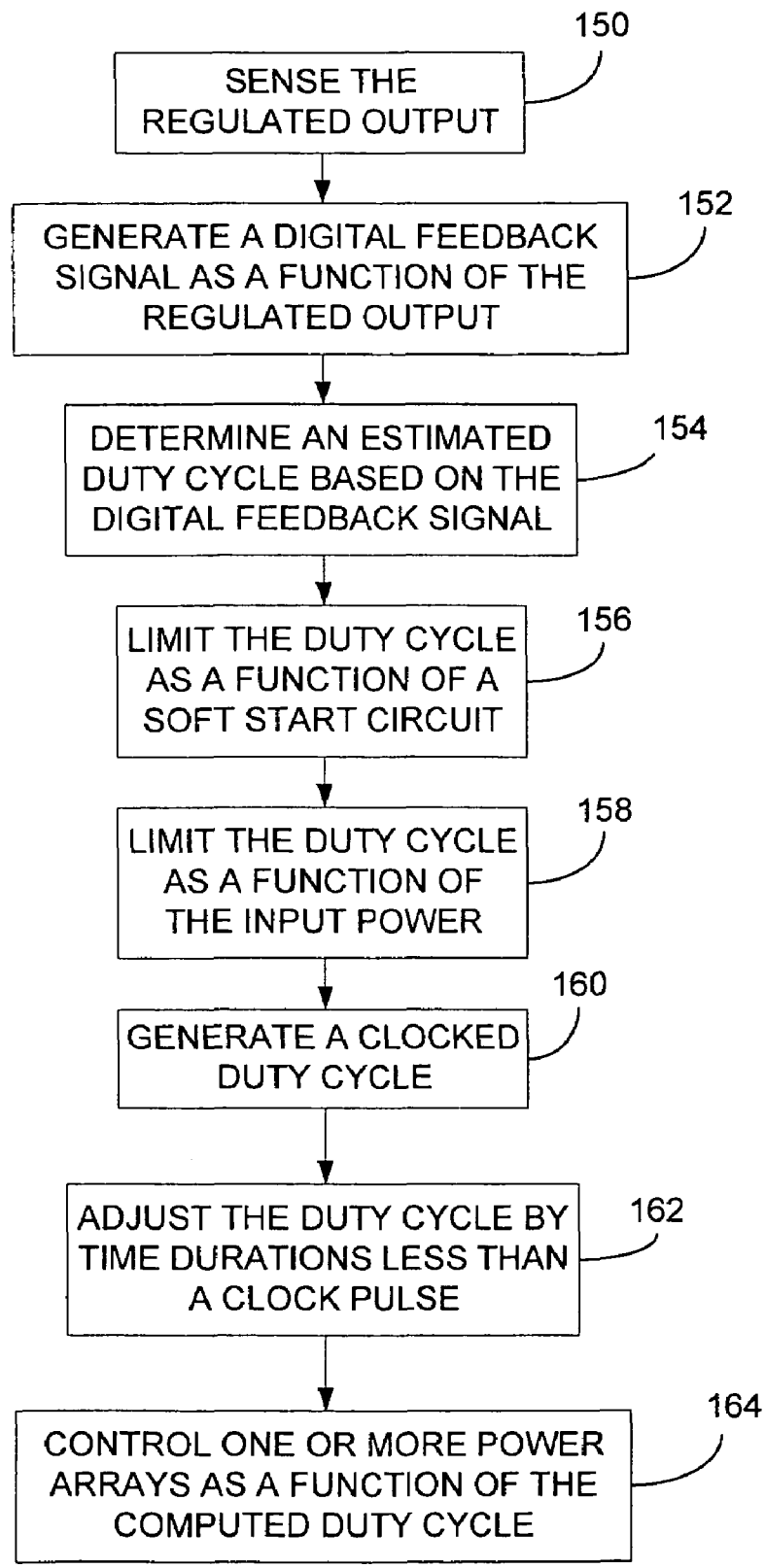
FIG. 3 is a flow diagram of an aspect of the operation of a digital controller for an output regulator.

FIG. 3 shows an aspect of an operating mode of the voltage converter 100. At block 150, the regulated output is sensed and compared to a reference. The sensed regulated output may be any electrical characteristic such as voltage and current. At block 152, a digital feedback signal is generated as a function of the sensed regulated output. The digital feedback signal may be a multi-bit signal. Each value of the digital feedback signal may correspond to a range of analog values of the sensed regulated output. At block 154, an estimated duty cycle is determined based on the digital feedback signal. The estimated duty cycle may be represented as a counter limit to be applied to a counter. The counter may generate a pulse as a function of a clock signal and the counter limit. At block 156, a soft start signal is generated to limit energy transfer to the regulated output during turn-on. The soft-start signal limits the duty cycle over which the power arrays over driven. At block 158, an input limit signal is generated to limit energy transfer to the regulated output as a function of the input power. For example, power transfer may be limited when the input voltage is less than a predetermined voltage or the input current is greater than a predetermined current. At block 160, a clocked duty cycle may be generated. At block 162, the clocked duty cycle is adjusted by time durations less than a clock pulse of theclock signal. For example, the resolution of the clocked duty cycle may be limited by the frequency of the clock so that the clocked duty cycle does not equal the estimated duty cycle being either greater or less than the estimated duty cycle. The clocked duty cycle may then be increased or decreased to more nearly equal the estimated duty cycle. At block 164, one or more power arrays may be controlled as a function of the computed duty cycle to transfer energy to the regulated output.

Multi-Mode Control System

Figure 4:
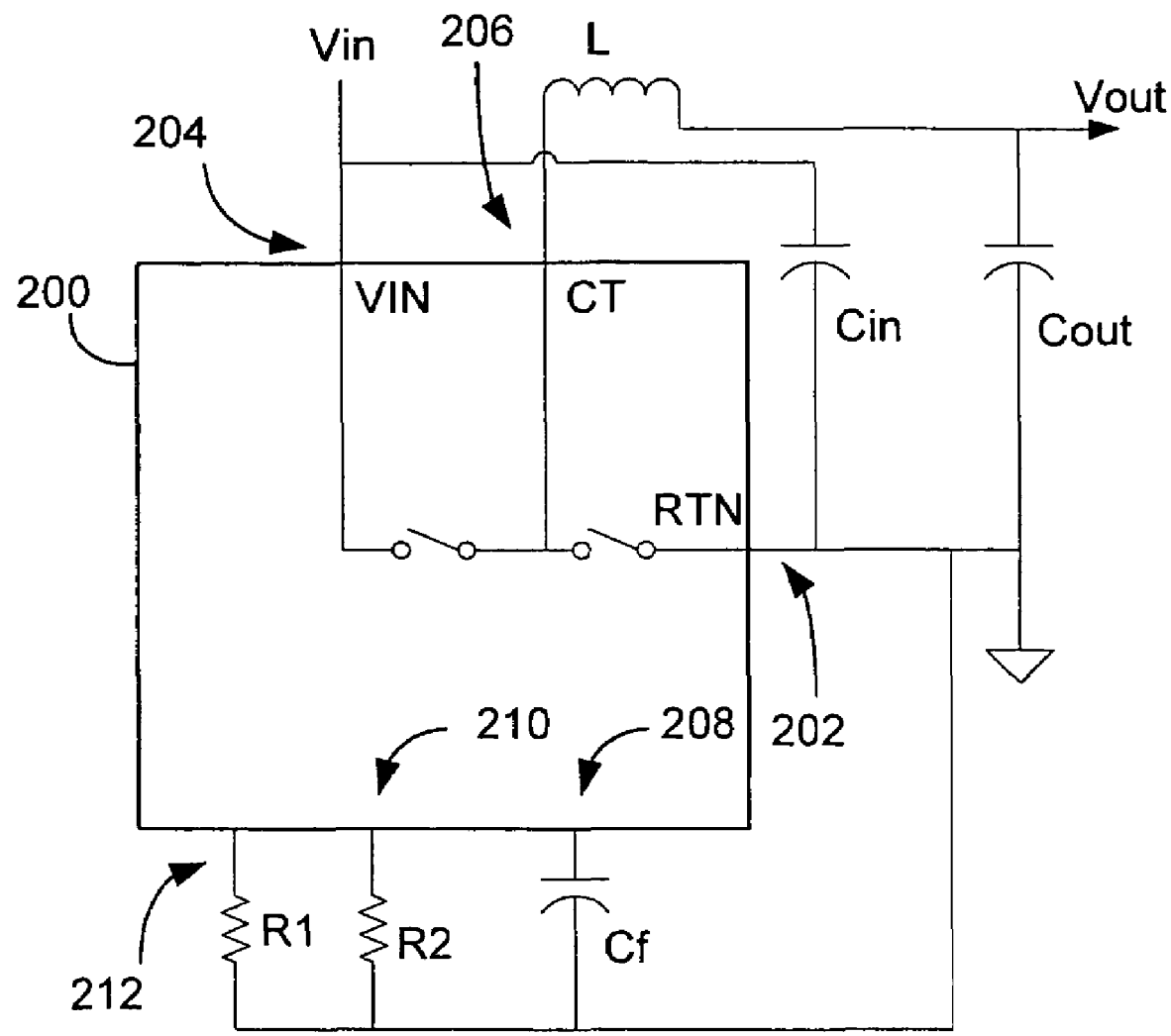
FIG. 4 is a two dimensional view of a package for an output regulator.
Figure 5:
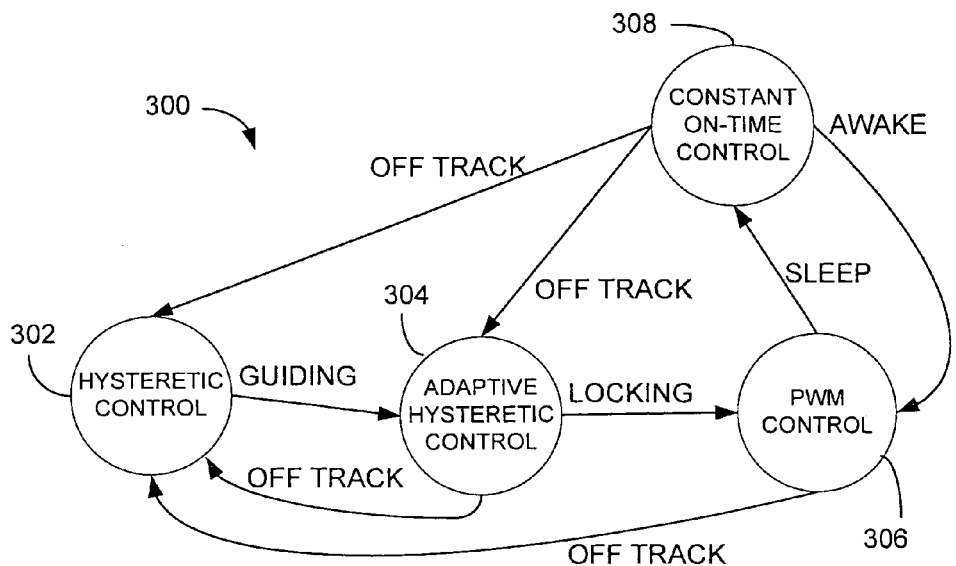
FIG. 5 is a state diagram of an aspect of an adaptive multi-mode control system.

FIG. 4 shows an aspect of a package configuration for the voltage converter 100. The package configuration advantageously reduces susceptibility to noise generated from the operation of the voltage converter 100. A package 200 includes a digital controller and power switches for controlling the flow of energy in the voltage converter 100. The pin configuration of the package 200 provides for improved routing of traces associated with the voltage converter 100. A return pin 202 may be located along a first side of the package 200. The return pin 202 provides a return current path for current flowing to Vout. A Vin pin 204 and a center-tap pin, CT, 206 may be located along a second side of the package 200. Pins 208-212 for control Input/Output (I/O) may be located along a third side of the package 200. Control I/Oregulator characteristic may be used such as output voltage, output current, bias current, switch current, and temperature wherein each of the characteristics may be any mathematical form such as peak, average, weighted average, rate of change, and instantaneous.

Figure 6:
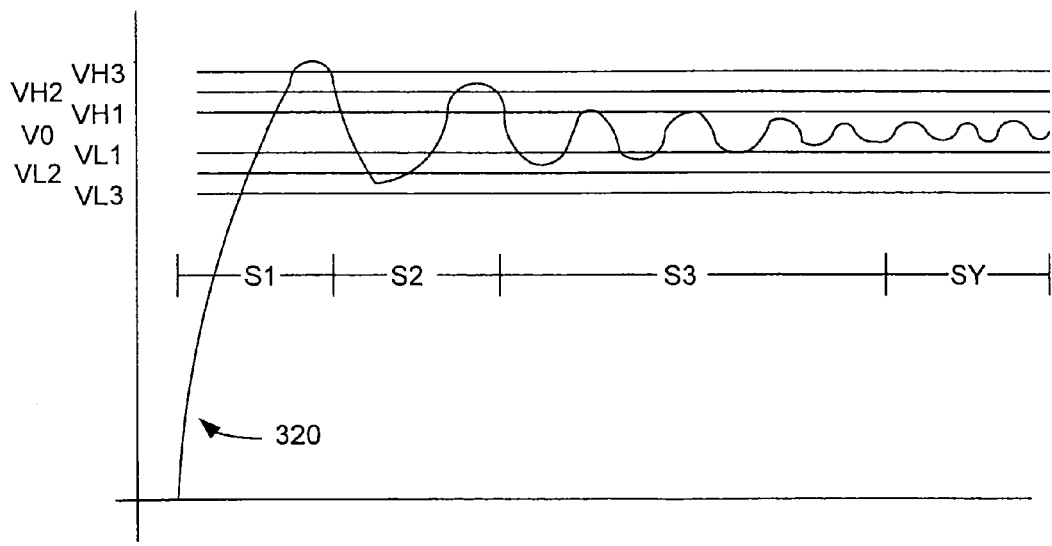

In one exemplary configuration for a switching regulator, the adaptive multi-mode control system 300 may start in voltage-mode hysteretic control 302 when the switching regulator turns-on. FIG. 6 shows a regulated output voltage 320 of the switching regulator during several operating states.

During voltage-mode hysteretic control, S1, 302 the regulated output voltage 320 quickly ramps up towards the steady-state value. In voltage-mode hysteretic control, S1, 302, energy is transferred to the regulated output voltage 320 when the voltage is less than a reference voltage such as V0. When the regulated output voltage 320 increases to greater than V0, the multi-mode control system 300 interrupts the drive signals, and after a short time delay, the transfer of energy halts.

The adaptive multi-mode control system 300 may switch to voltage-mode adaptive hysteretic control, S2, 304 when the regulated output voltage 320 is within a range of values such as VH3 and VL3. In voltage-mode adaptive hysteretic control, S2, 304 the maximum on-time and the maximum off-time under hysteretic control are limited to reduce the rate at which energy is transferred to the regulated output, reducing the amplitude of ringing about the steady-state value.

The adaptive multi-mode control system 300 may switch to voltage-mode or current-mode pulse-width-modulation (PWM) control, S3, 306 as the ringing of the regulated output voltage decreases. During voltage-mode PWM control, S3, 306 the output regulator operates at a constant frequency and regulates the output voltage by controlling the duty cycle at which energy is transferred to the output. Switching to voltage-mode PWM control, S3, 306 may be based on the output current of the output regulator, the output voltage, and the voltage range over which the output voltage varies.

Constant on-time current-mode control, SY, 308 may be switched to for conserving energy when the output current decreases below a light load limit. During constant on-time current-mode control, SY, 308 the off-time of the switching regulator may be controlled to maintain a regulated output. As the output current decreases, the switching frequency of the switching regulator may decrease or cease completely, reducing the switching losses of the switching regulator. During no load or very light load conditions the switching regulator may enter a hibernation mode in which the clock ceases.

Figure 7:
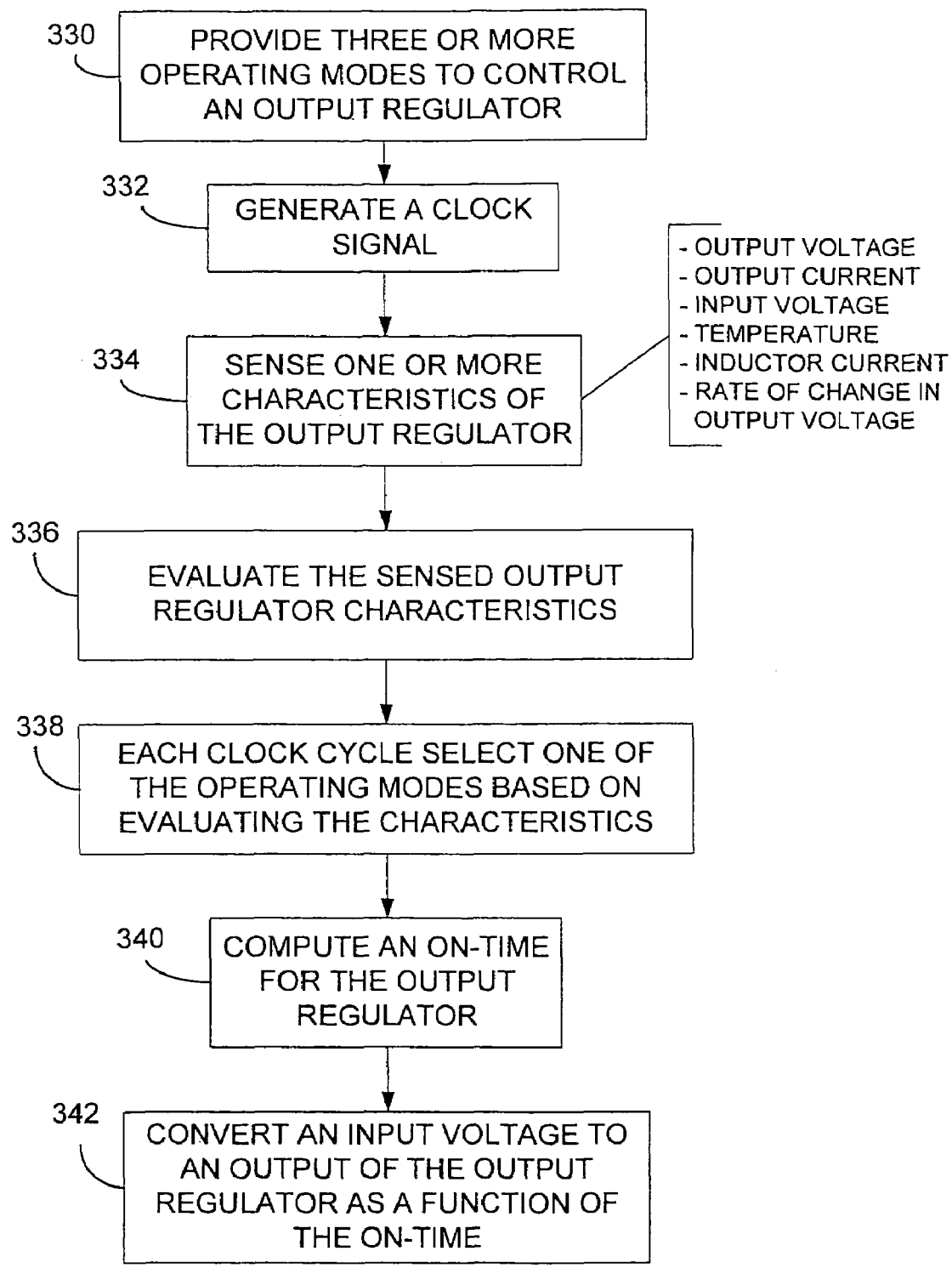
FIG. 7 is a flow diagram of an aspect of the operation of an adaptive multi-mode control system.

FIG. 7 shows an aspect of an adaptive multi-mode control system. At block 330, three or more operating modes are provided for controlling an output regulator. The operating modes may be configured in any clock driven medium such as firmware, software, and hardware. At block 332, a clock signal is generated for operating the multi-mode control system 300. At block 334, one or more characteristics of the output regulator may be sensed. The output regulator characteristics may be sensed as a function of the clock cycle such as a number of clock cycles corresponding to a minimum on-time or duty cycle of the output regulator. At block 336, the sensed output regulator characteristics may be evaluated to determine which operating mode to use. At block 338, one of the operating modes may be selected based on the evaluation. The evaluation of the output regulator characteristics and the selection of the operating mode may be done on a cycle-by-cycle basis at a sampling frequency such as every clock cycle and once every predetermined number of clock cycles. At block 340, the selected operating mode is used to compute the on-time to which the output regulator will be set for the next conduction cycle. At block 342, the output regulator converts an input voltage to an output of the output regulator as a function of the computed on-time.

Output Slicer.

Figure 8:
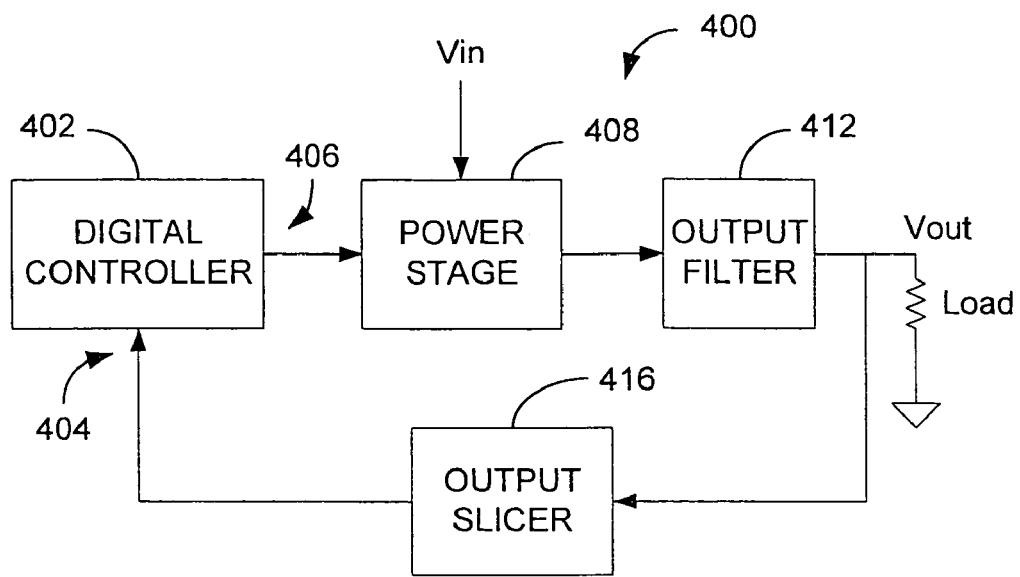
FIG. 8 is a block diagram of an aspect of an output regulator having an output slicer.

FIG. 8 shows an aspect of an output regulator 400 for generating a regulated output. The output regulator 400 may include a digital controller 402 to receive a feedback signal 404 and to generate one or more drive signals 406 to drive a power stage 408. The power stage 408 converts an unregulated voltage, such as Vin, to a chopped waveform that is filtered by an output filter 412 to generate a regulated output 414. The regulated output, Vout, is preferably a DC output and may be regulated based on any output characteristic including voltage, current, and power.

Figure 9:
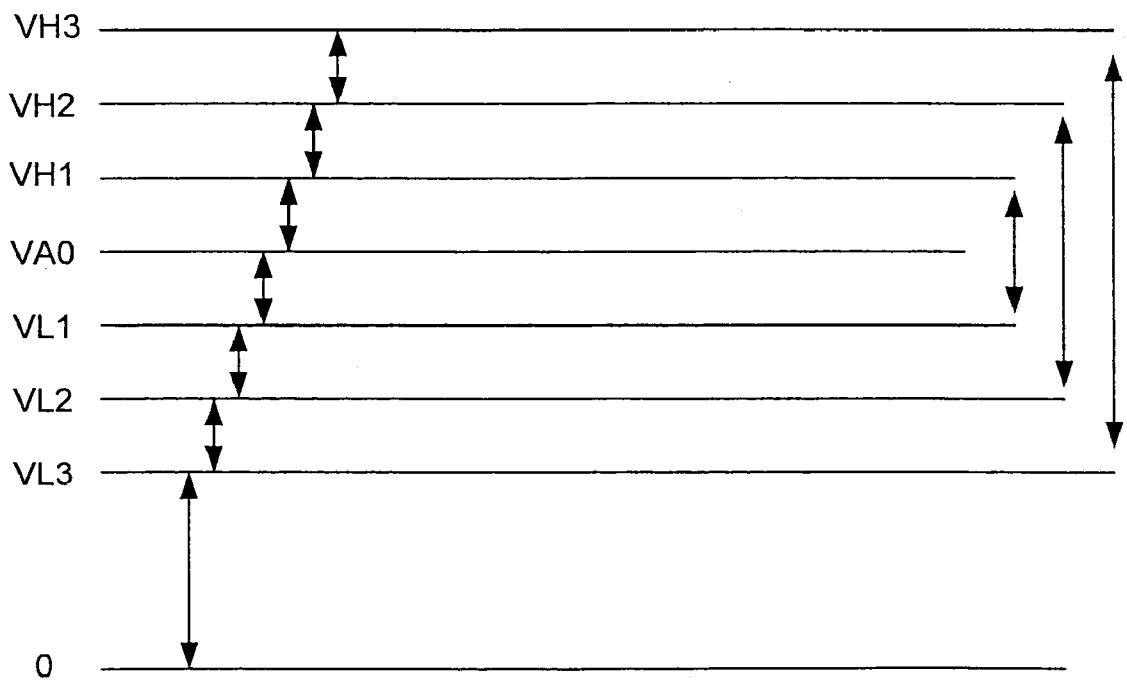
FIG. 9 is a diagram of an aspect of the relationship between voltage ranges.

An output slicer 416 may generate the feedback signal 404 in response to sensing the output voltage. The output slicer 416 may determine a range of voltages within which the output voltage is included. The output slicer 416 may determine two or more voltage ranges to describe a combined range of voltages, and then determine the voltage range within which the output voltage is included. For example, a combined range of voltages extending from 0 volts to 10 volts may be described by a first voltage range from 0 volts to 8 volts, a second voltage range from 8 volts to 9 volts, a third voltage range from 9 volts to 10 volts, and a fourth voltage range being 10 volts and greater. If the output voltage is 8.5 volts, then the output voltage lies within the second range. The voltage ranges may be selected to be overlapping as well as consecutive. FIG. 9 shows an example of an overlapping configuration of voltage ranges. A first voltage range extends from 0 volts to VL3 volts. A second voltage range extends from VL3 volts to VH3 volts. A third voltage range extends from VL2 volts to VH2 volts. A fourth voltage range extends from VL1 volts to VH1 volts. The second, third and fourth voltage ranges may describe voltage regulation limits about a nominal voltage of VAO. In another alternative, the voltage ranges may be selected to extend consecutively such as from 0 to VL3, VL3 to VL2, VL2 to VL1, VL1 to VH1, VH1 to VH2, and VH2 to VH3.

The output slicer 416 may set the voltage ranges dynamically on a cycle-by-cycle basis at the sampling frequency. For example, one or more of the reference levels such as VL3 may be changed each cycle so that voltages encompassed by each voltage range may change each cycle. In another aspect, the reference levels may be controlled as a function of the ripple voltage of the regulated output. For example, the reference levels lying closest to the nominal level of the regulated output may be adjusted to ensure the ripple voltage is a predetermined percentage of the voltage range encompassed by the reference levels. In another aspect, during a voltage transient condition, the voltage ranges may be set to relatively broad ranges, while during steady-state, the voltage ranges may be set to narrow ranges. Also on a cycle-by-cycle basis, the configuration of the voltage ranges may be changed such as from consecutive to overlapping. Although, the output slicer 416 is described as having voltage references, current references may also be used to define current ranges to which a current may be compared.

The output slicer 416 may compare the output voltage to the predetermined voltage ranges and select a digital value to represent the voltage range within which the output voltage is. The feedback signal 404 is a digital signal having two or more bits to represent the voltage range that corresponds to the output voltage, such as a digital bus carrying a decoded signal and separate digital lines to represent each voltage range.

Figure 10:
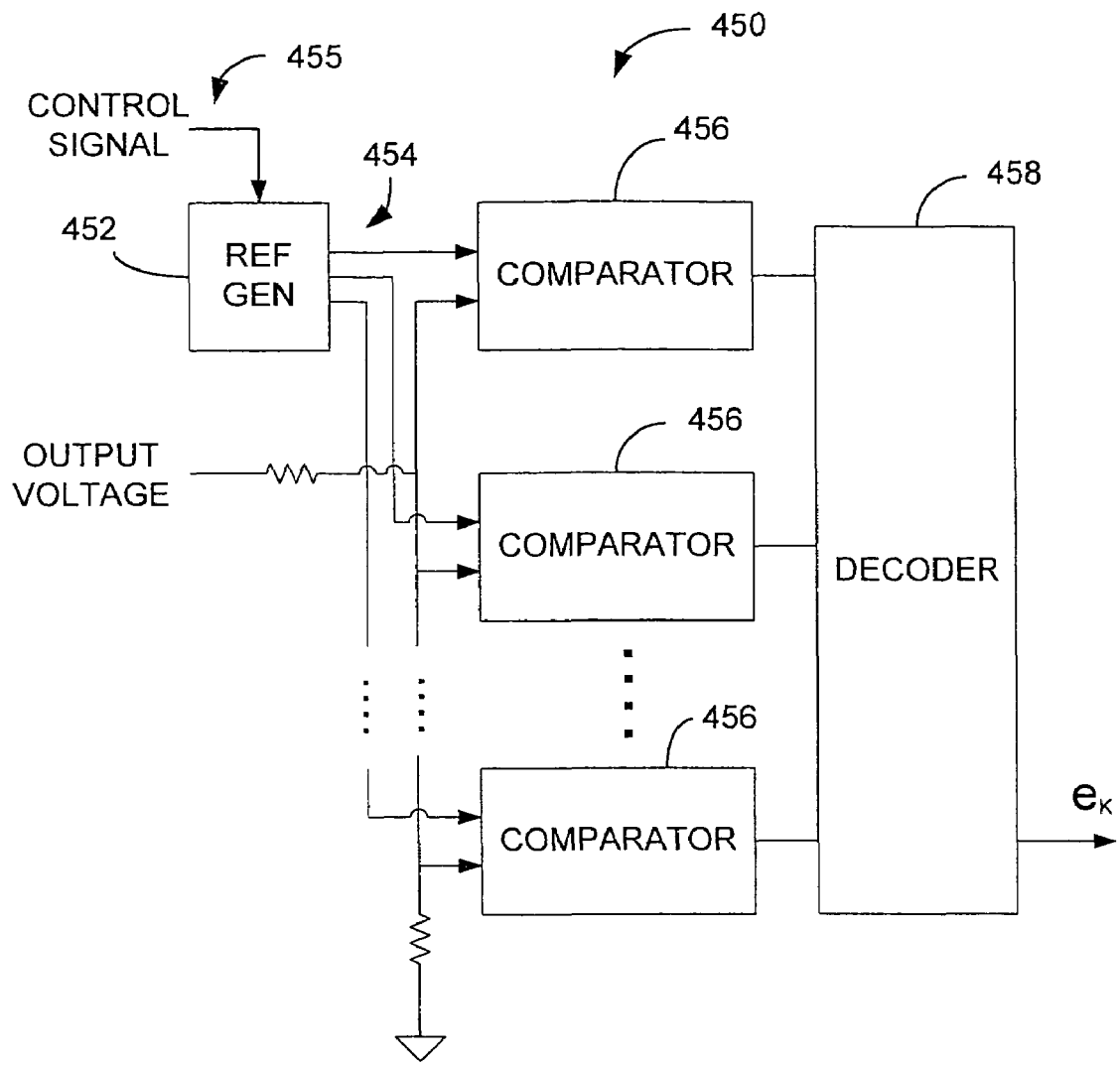
FIG. 10 is a block diagram of an aspect of an output slicer.

FIG. 10 shows an aspect of a voltage slicer 450 for generating a digital value to represent a voltage range within which a sensed voltage is included. A reference generator 452 may generate several voltage references 454 for setting voltage limits for each of the voltage ranges. There may be any arrangement of voltage references such as assigning individual voltage references 454 for each voltage limit and deriving multiple voltage limits from a single voltage reference.

A control signal 455 may dynamically control the voltage references so that the voltage limits may be controlled on a cycle-by-cycle basis at the sampling frequency. The control signal 455 may control one or more of the voltage references and switch the voltage references between two or more voltage levels. The control signal 455 may be analog, digital, mixed-signal, parallel, serial, one or more lines and combinations thereof.

One or more comparators 456 may compare the output voltage to the voltage limits 454. When multiple comparators 456 are used, the comparators may operate in parallel to compare the output voltage to each of the voltage limits defining voltage ranges. In one alternative, a single comparator 456 may be used to compare the output voltage with a controlled voltage reference that may be sequenced on clock transitions through values corresponding to the voltage limits.

An encoder 458 may encode the outputs of the comparators 450 to a digital signal having two or more bits. The digital signal may be any format such as parallel and serial.

Figure 11:
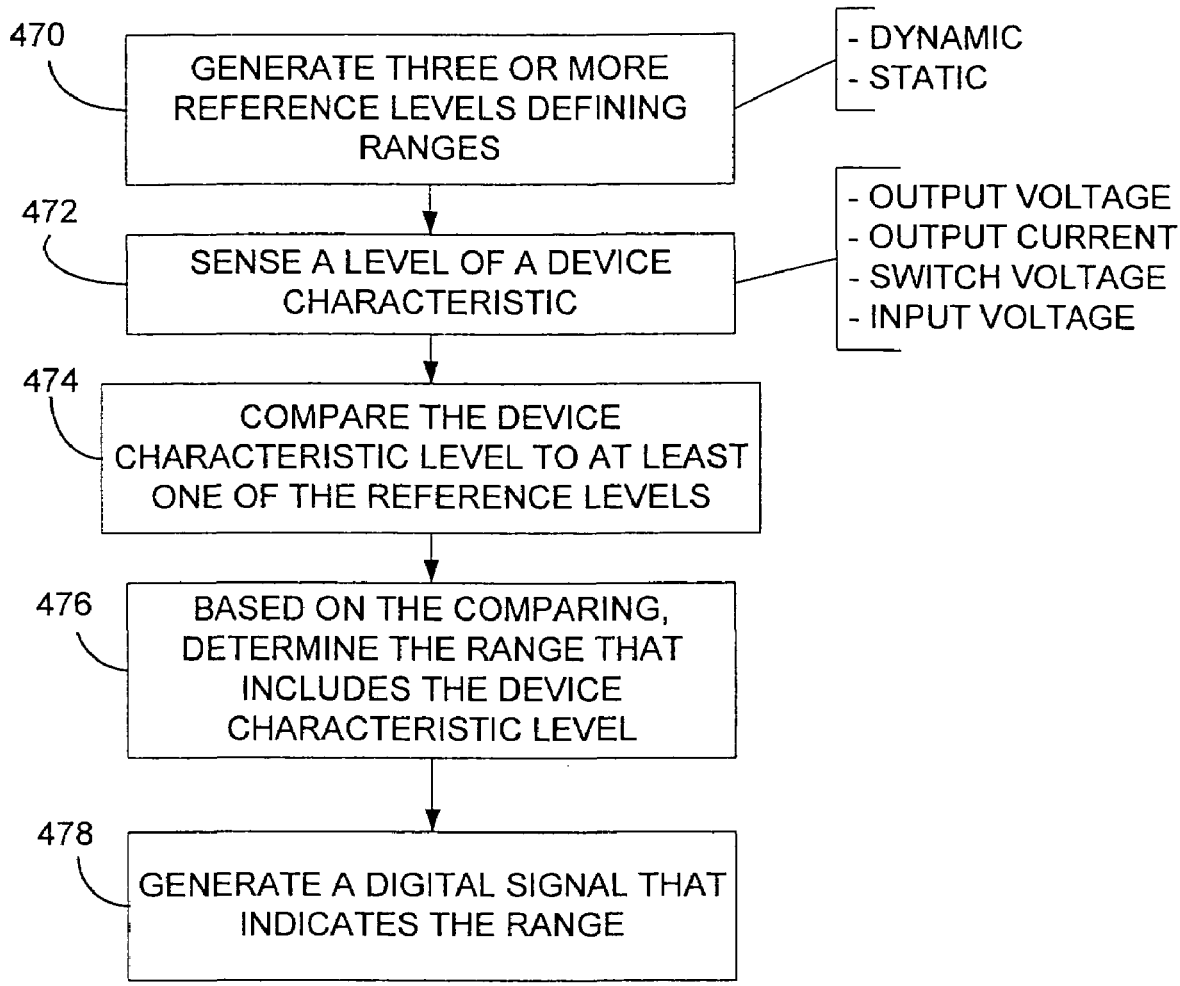
FIG. 11 is a flow diagram of an aspect of the operation of an output slicer.

FIG. 11 shows an operation of a voltage slicer. At block 470, three or more reference levels may be generated to define voltage ranges. The reference levels may be static or dynamic. Static reference levels may be maintained at a constant level. Dynamic reference levels may controlled on a cycle-by-cycle basis so that the voltage ranges may be changed dynamically. For example, during turn-on of a power regulator when the regulator output is increasing, the voltage ranges may be set to be 10% of the steady-state level of the power regulator output. Then, when the power regulator output begins to settle towards the steady-state level, the voltage ranges may be decreased to 5% of the steady-state level. At step 472, the level of a device characteristic may be sensed. Any device characteristic may be sensed such as output voltage, output current, switch voltage, inductor current, and input voltage. At step 474, the device characteristic may be compared to at least one of the reference levels. At step 476, the voltage range within which the level of the device characteristic lies may be determined based on step 474. At step 478, a digital signal is generated to indicate the range within which the level of the device characteristic lies.

Power Array

Figure 12A:
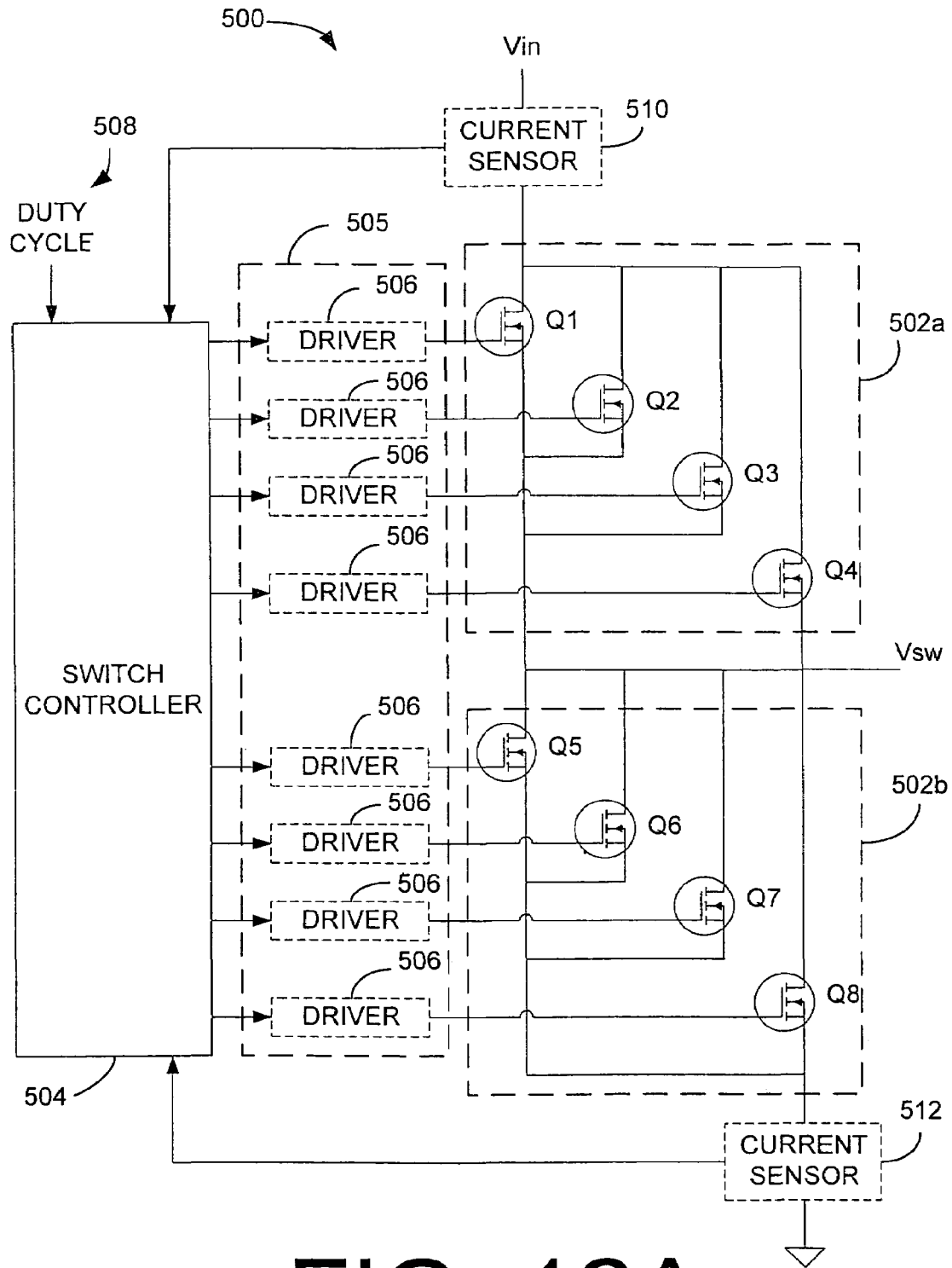
FIG. 12A is a block diagram of an aspect of a power array.

FIG. 12A shows an aspect of a power array 500 to generate a chopped voltage from an input voltage. The power array 500 may be included in a power regulator such as power regulator 10 described in this specification. The power array 500 may include one or more switch arrays 502a and 502b of power switches Q1–Q8 to control the flow of energy between two nodes. The power switches Q1–Q8 may each operate independently in two states, an on state and an off state. In the on state, the power switch has a low impedance and conducts energy between the two nodes. In the off state, the power switch has a high impedance and blocks the flow of energy between the two nodes. Any quantity and type of switching device may be used for the power switches such as MOSFETs, BJTs, MCTs, IGBTs, and Radio Frequency (RF) FETs. The power switches Q1–Q8 may include any mixture of sizes such as for MOSFETs, one device may have an Rds(on) of 0.1 ohm while other devices have an Rds(on) of 0.2 ohm and 0.4 ohm respectively.

The switch arrays 502a and 502b may be connected as any topology such as buck, boost, flyback, Cuk, sepic, and zeta. Here, the switch arrays 502a and 502b are connected as a buck topology in which the upper switch array 502a conducts energy during a conduction period and the lower switch array 502b conducts energy during a free-wheeling period. The switch arrays 502a and 502b may comprise any combination of power switches such as MOSFETs, BJTs, MCTs, IGBTs, and RF FETs.

A driver array 505 buffers drive signals from a switch controller 504 to the power switches Q1–Q8. The driver array 505 may include several drivers 506. Each of the drivers 506 preferably drives a single power switch, however each driver 506 may drive more than one of the power switches Q1–Q8. The drivers 506 improve the switching speed of the power switches Q1–Q8 to reduce switching losses as the power switches transition between the on state and off state. Any type of circuits and devices may be used for the drivers 506 to improve the switching speed of the power switches Q1–Q8.

A switch controller 504 generates drive signals for controlling the power switches Q1–Q8. The switch controller 504 operates digitally and may be implemented as any form of digital entity such as digital circuitry, and a programmable device executing software or firmware. The switch controller 504 may receive a duty cycle signal 508 and generate the drive signals based on the duty cycle signal 508. The switch controller 504 may operate on a cycle-by-cycle basis at the sampling frequency to determine the drive signals. The sampling frequency may be 20 times or more higher than the switching frequency of the output regulator. For example, during fixed frequency operation the output regulator may operate between 50 kHz and 1 MHz while the sampling frequency may range between 1 MHz and 100 MHz. The switch controller 504 may determine the drive signals each clock cycle corresponding to the sampling frequency.

Each of the power switches Q1–Q8 may be independently enabled or disabled on a cycle-by-cycle basis. The quantity of power switches within a switch array that are enabled may be controlled. The quantity of enabled/disabled power switches Q1–Q8 may be determined on the basis of any operating characteristic such as output current, ambient temperature, operating temperature, output voltage, and inductor current. For example, when the output current is equal to about half of the maximum output current, only two of four power switches in each switch array may be enabled so that the switching losses of the power switches are minimized. In another aspect, as the current ramps up in the switches during a conduction period, additional power switches may be enabled to reduce conduction losses. Similarly, during a transient load change, the quantity of power switches may be increased or decreased, thereby for example reducing switching and conduction losses.

The switch controller 504 may control each of the power switches Q1–Q8 independently via the drive signals so that the time relationship between each of the power switches during transitions between the on and off states may be controlled cycle-by-cycle. The time sequence of the on and off transitions of the power switches Q1–Q4 and Q5–Q8 within each of the switch arrays 502a and 502b may be individually controlled. For example, referring to FIG. 13, which shows waveforms associated with an aspect of the power array 500, an off state to on state transition 520 of the power switches Q1–Q4 may be controlled so that first Q4 turns off, followed by Q2 and Q3 together, and finally Q1.

The time sequence may be controlled in any manner such as on the basis of the current flowing through the power switches, using predetermined delay times between transitions, triggering the transition of one power switch on the completion of the transition of another power switch, and on the basis of voltage transients on the node common to the switch arrays.

Current sensors 510 and 512 may sense current flowing through the power switches Q1–Q8. The current flowing through the power switches Q1–Q8 may be sensed at any location in the output regulator such as in series with an output inductor, in series with the upper switch array 502a, and in series with the lower switch array 502b. Any type of current sensor may be used such as transformer-resistor sensors, inductor-resistor sensors, hall effect sensors, DC current sensors, AC current sensors, inductor-tertiary winding sensors, and series resistors.

Figure 14:
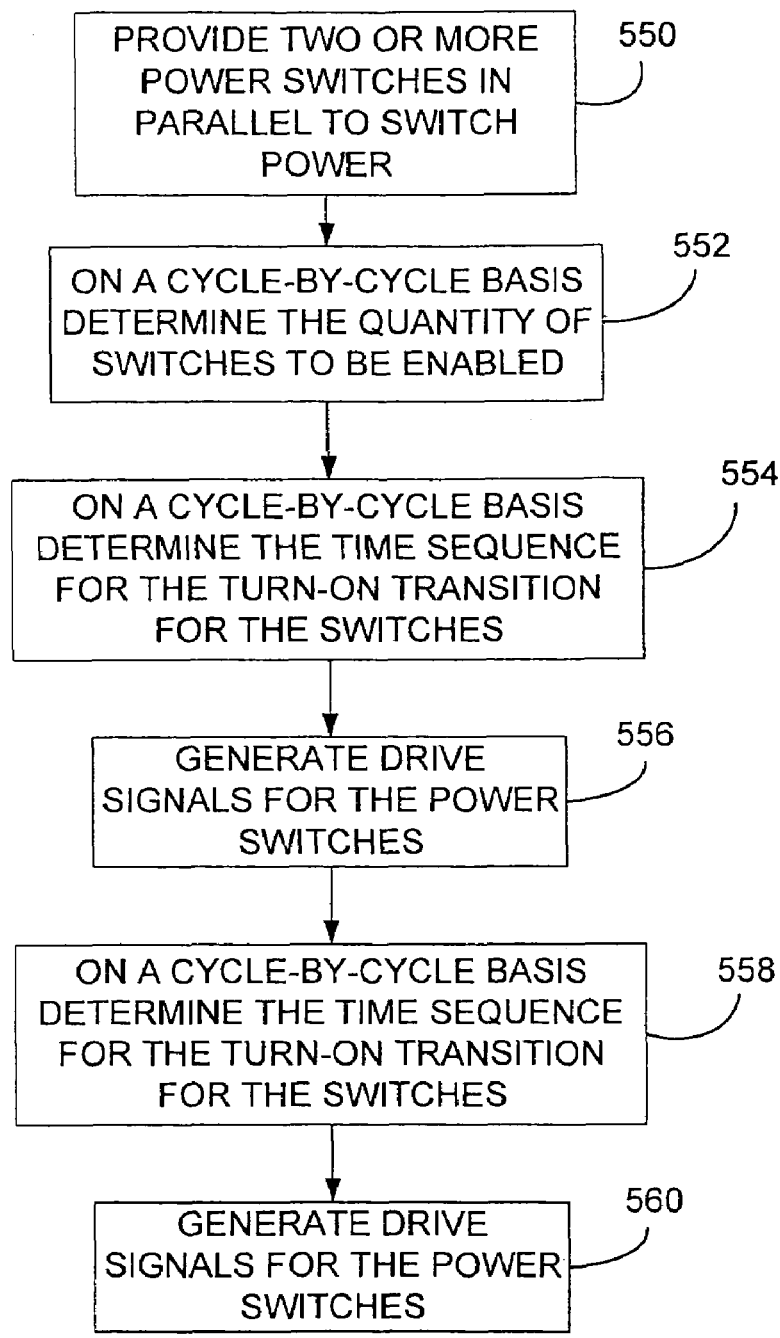
FIG. 14 is a flow diagram of an aspect of an operation of a power switch array for a power array for controlling the flow of energy in a power regulator.

FIG. 14 shows an operation of a power switch array for a power array for controlling the flow of energy in a power regulator. At step 550, two or more switches in parallel are provided for controlling the flow of energy in a power regulator. Preferably, each of the power switches receives an independent drive signal. However, the switches may be arranged into two or more groups of power switches that each receive independent drive signals. At step 552, the quantity of power switches to be enabled is determined. The quantity of power switches may be adjusted to reduce power losses in the power switches including switching losses and conduction losses. For example, the output current or switch current may be sensed and the quantity of power switches that are enabled be controlled based on the sensed current. By reducing the quantity of power switches that are enabled when there are lower operating currents flowing through the power switches, the switching losses may be reduced. At step 554, the time sequence for the turn-on transition of the power switches is determined. The time sequence for the turn-on transition may be determined based on any technique such as selecting fixed time delays between switch transitions, and selecting time delays based on the voltage regulator operating characteristics such as voltage levels, current levels, and operating temperatures. At step 556, drive signals are generated to control the turn-on transition of the power switches. At step 558, the time sequence for the turn-off transition is determined. The time sequence for the turn-off transition is not limited by the time sequence that is determined for the turn-on transition. Preferably, the turn-off transition time sequence is determined independently of the turn-on sequence. However, the turn-off transition time sequence may be determined based on the turn-on sequence such as by mirroring the turn-on transition time sequence. At step 560, drive signals for the turn-off transition are generated.

Current Sensing

Figure 13:
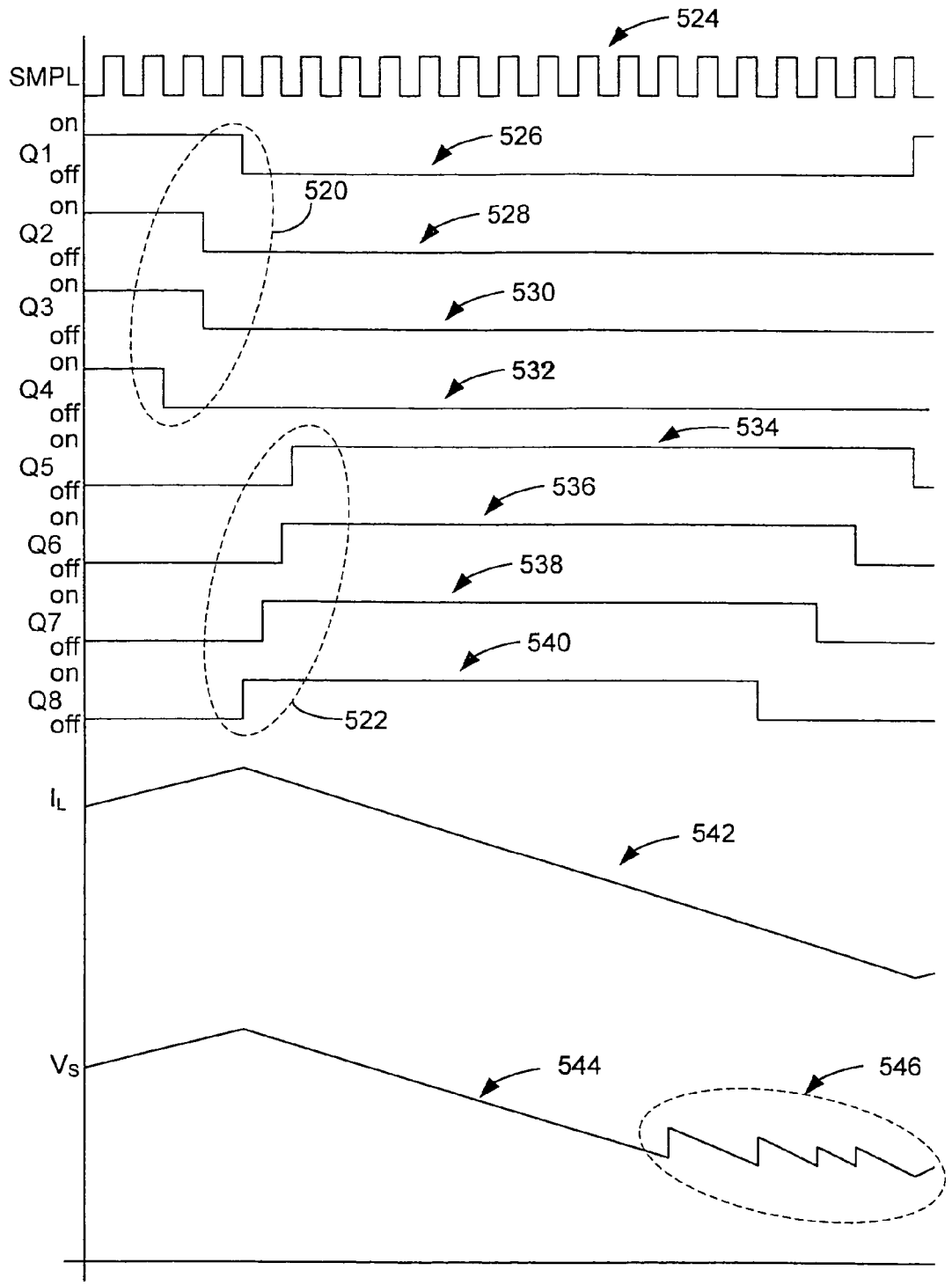
FIG. 13 is a timing diagram of waveforms associated with an aspect of sensing current in a power array.

FIG. 13 shows an aspect of a current sensing operation of the power array 500. A sampling waveform, SMPL, 524 shows an exemplary sampling rate. Waveforms 526–540 show a portion of a conduction cycle for the power switches Q1–Q8. Waveform 542 shows current flowing through an output inductor. The current in the inductor decreases at a linear rate during a freewheeling portion of the conduction cycle of the power array 500. Waveform 544 shows a sense voltage. The sense voltage may be equal to a sense impedance times a sense current corresponding to the current flowing through the output inductor. The resolution of the sense voltage may be adjusted on a cycle-by-cycle basis at the sampling frequency. An encircled portion 546 of the sense voltage waveform 544 shows the resolution of the sense voltage being increased as the inductor current decreases in amplitude. In one respect, the power array 500 zooms in to increase the resolution of the sensed current. The resolution may be controlled in any manner on a cycle-by-cycle basis at the sampling frequency. In one aspect, the resolution may be controlled by amplifying the sense current signal based on a resolution trigger such as the sense current amplitude, the quantity of power switches that are enabled, and a predetermined time in the conduction cycle. In another aspect, the resolution may be controlled by controlling the impedance of the current sensing device such as by; 1) sensing current across the ON impedance of the power switches and 2) controlling the quantity of power switches that operate in parallel during the conduction cycle. Other sensing circuits such as transformer-resistor sensors, inductor-resistor, and Hall effect devices the impedance of the sensing device such as a resistor may be controlled. In each case, the resolution may be controlled at the sampling frequency throughout the conduction cycle so that as the amplitude of the sensed current decreases, the power array 500 may zoom in during the conduction cycle to increase the resolution.

Figure 15:
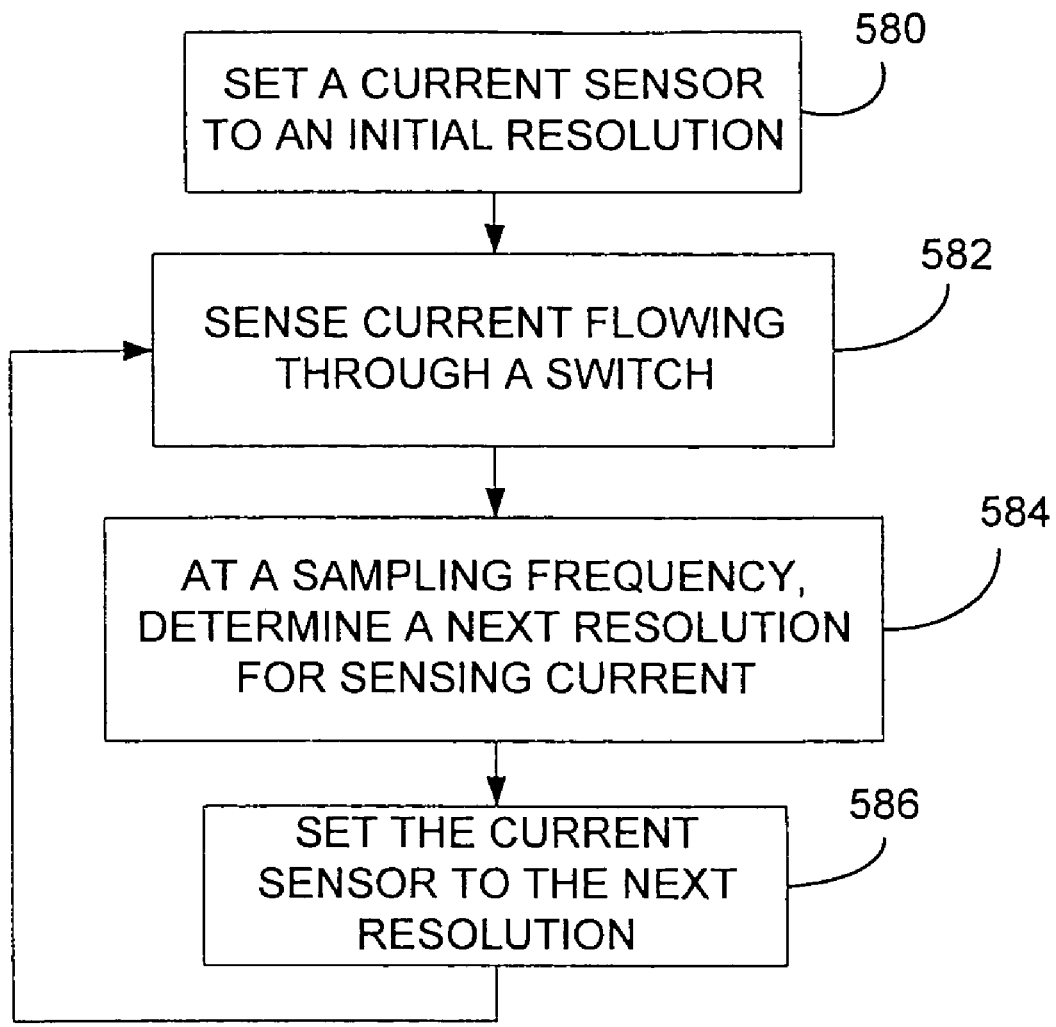
FIG. 15 is a flow diagram of an aspect of the operation of a current sensing technique.

FIG. 15 shows an aspect of the operation of a current sensing technique. At step 580, a current sensor is set to an initial resolution for sensing a current. At step 582, current flowing through one or more of the power switches Q1–Q8 is sensed. The current may be sensed indirectly as well as directly. For example, the drain-source voltage, Vds, of parallel MOSFETs may be sensed and the current computed from Vds and the known ON resistance of the MOSFETs. At step 584, on a cycle-by-cycle basis at the sampling frequency a next resolution for the current sensor may be determined. The next resolution may be selected to minimize noise errors by maximizing the amplitude of the sense signal within the constraints of the sensing circuit. At step 586, the current sensor is set to the next resolution and then the current flowing through the switch is sensed again at the next cycle.

Free-Wheeling Diode Emulation

Figure 16:
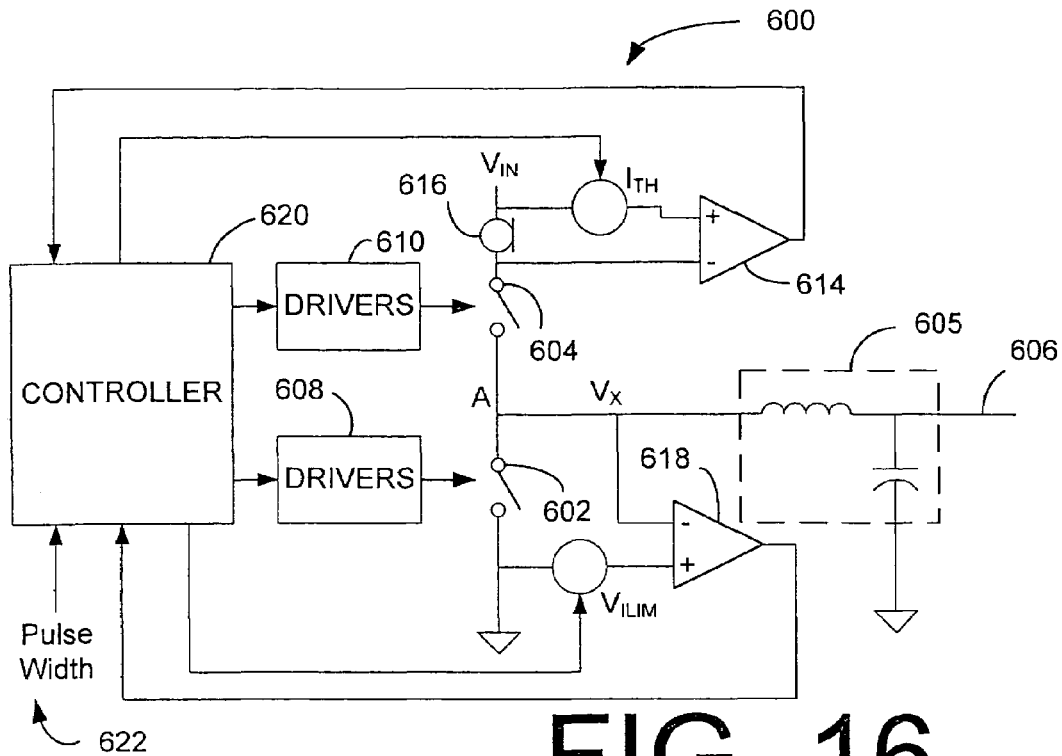
FIG. 16 is a block diagram of an aspect of a diode emulation system for emulating a free-wheeling diode of an output regulator that operates as a switching regulator.

FIG. 16 shows an aspect of a diode emulation system 600 for emulating a free-wheeling diode of an output regulator that operates as a switching regulator. The output regulator includes an output filter 605. Although the diode emulation system 600 is shown in a buck topology with a groundreferenced output, any topology may be used such as boost, buck-boost, cuk, sepic, and zeta, and the output may be referenced to any circuit node such as high-side reference and low-side reference. The diode emulation system 600 advantageously uses a free-wheeling switch array 602 to emulate a free-wheeling diode of the output regulator. The freewheeling switch array 602 may include several power switches connected in parallel and independently controlled. The power switches may be selected to have combined lower conduction losses than a comparable free-wheeling diode to reduce conduction and switching losses during the freewheeling phase of the output regulator. The freewheeling switch array 602 may also provide a controlled impedance to reduce noise generation and a current path for negative currents during light load conditions such as discontinuous mode operation. The power switches of the free-wheeling switch array 602 and a first power switch 604 each operate in either an on state or an off state to control the flow of energy from an input power source, Vin, to a regulated output 606. Each of the power switches may be configured as any grouping of power switches such as single power switches and an array of power switches. The power switches may be any type of switching device such as MOSFETs, BJTs, MCTs, and IGBTs. Drivers 608 and 610 may buffer the drive signals sent to the switch array 602 and power switch 604. The drivers 608 and 610 may decrease the switching and conduction losses of the power switches by increasing the switching speed of the power switches. Any type of driver may be used to drive the power switches.

An upper current sense circuit and a lower current sense circuit may sense the current flowing through the switch array 602 and the first power switch 604. Any type of current sensing circuit may be used such as shunt resistors, resistor-transformer, voltage sensing across a known impedance, and Hall effect. The lower current sense circuit may include a voltage reference $V_{ILIM}$ and a comparator 614 connected across the switch array 602. The comparator 614 may generate a freewheeling switch current signal in response to comparing the current flowing through the switch array 604 to the voltage reference $V_{ILIM}$. The voltage reference $V_{ILIM}$ may be set to a value based on the expected voltage drop developed across the first power switch while conducting current. The voltage reference may be programmable on a cycle-by-cycle basis so that for example, the lower current sense circuit threshold value may be adjusted to account for variations in the impedance of the freewheeling switch array 602 such as changes in the quantity of parallel power switches and temperature effects.

The upper current sense circuit may include a current sense circuit 616 to sense current flowing through the first power switch 604, a reference $I_{TN}$, and a comparator 618. The comparator 618 may compare the amplitude of the current flowing through the first power switch 602 to the reference ITH. The comparator may generate a conducting switch current signal. The reference Ith may be programmed on a cycle-bycycle basis.

A controller 620 may generate the drive signals for controlling the power switches 602 and 604. The controller 620 may determine the drive signals as a function of a pulse width signal 622. The outputs from the comparators 614 and 618 may also be used to determine the drive signals. For example, the controller 620 may, in response to sensing the current flowing through the freewheeling switch array 602 approaching zero amps, disable one or more power switches within the freewheeling switch array 602 to cause the voltage developed across the switch array 602 to increase improving the resolution of the comparator 618. The controller 620 may also either maintain or shift the level of the threshold voltage, $V_{ILIM}$, of the comparator 618 in preparation to disabling another power switch as the current in the freewheeling switch array 602 continues to decrease. In this manner, the controller 620 may zoom in as the current flowing through the freewheeling switch array 602 decreases. By disabling individual power switches within the switch array 602 as the current decreases, the impedance at the common node, "A", between the first power switch 604 and the switch array 602 gradually increases, dampening and suppressing noise on the common node.

In another example, during a light load condition, the controller 620 may operate the free-wheeling power switch 602 as a bi-directional switch so that current may flow in both the positive and the negative directions. The controller 620 may operate in a continuous output current mode at very light loads including zero output current.

Figure 17:
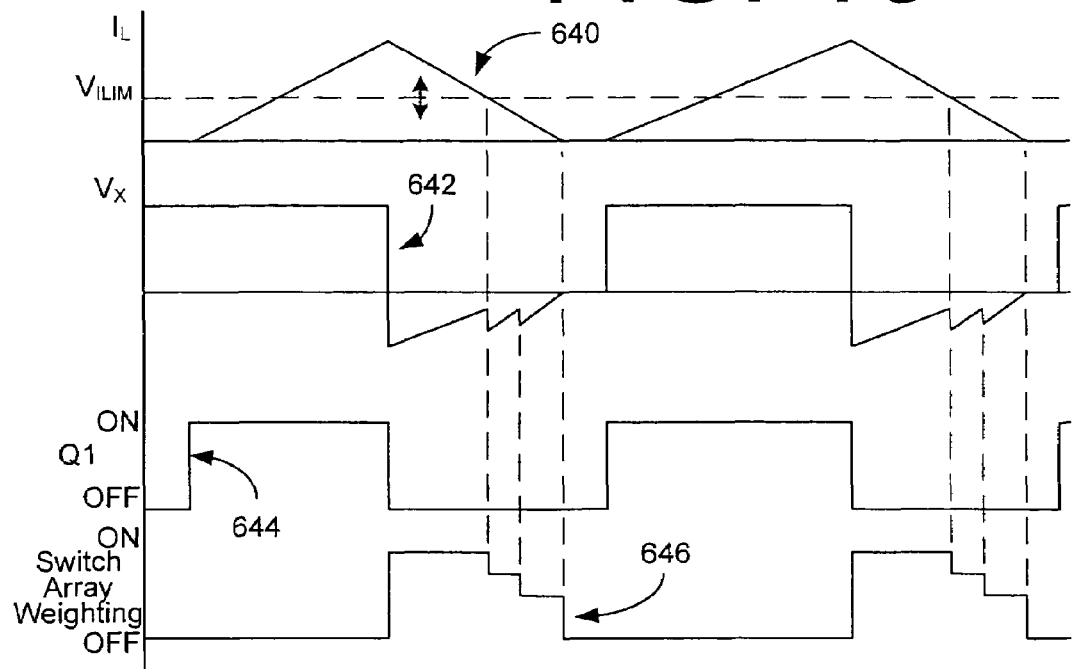
FIG. 17 is a timing diagram of waveforms associated with an aspect of a diode emulation system.

FIG. 17 shows waveforms associated with an aspect of the diode emulation system 600. A first waveform 640 shows current flowing through an inductor in the output filter 605. A second waveform 642 shows a voltage, Vx, on the common node. A third waveform 644 shows a drive signal for the first power switch 604. A fourth waveform 646 shows a weighted drive signal for the power switches of the free-wheeling switch array 602. Each of the levels of the fourth waveform indicate a different quantity of power switches that are enabled. For example, at higher current levels four power switches may be enabled. Then as the current decreases, one of the power switches may be disabled. As the current continues to decrease, two more power switches may be disabled. Finally, the remainder of the power switches in the switch array 602 may be disabled.

Figure 18:
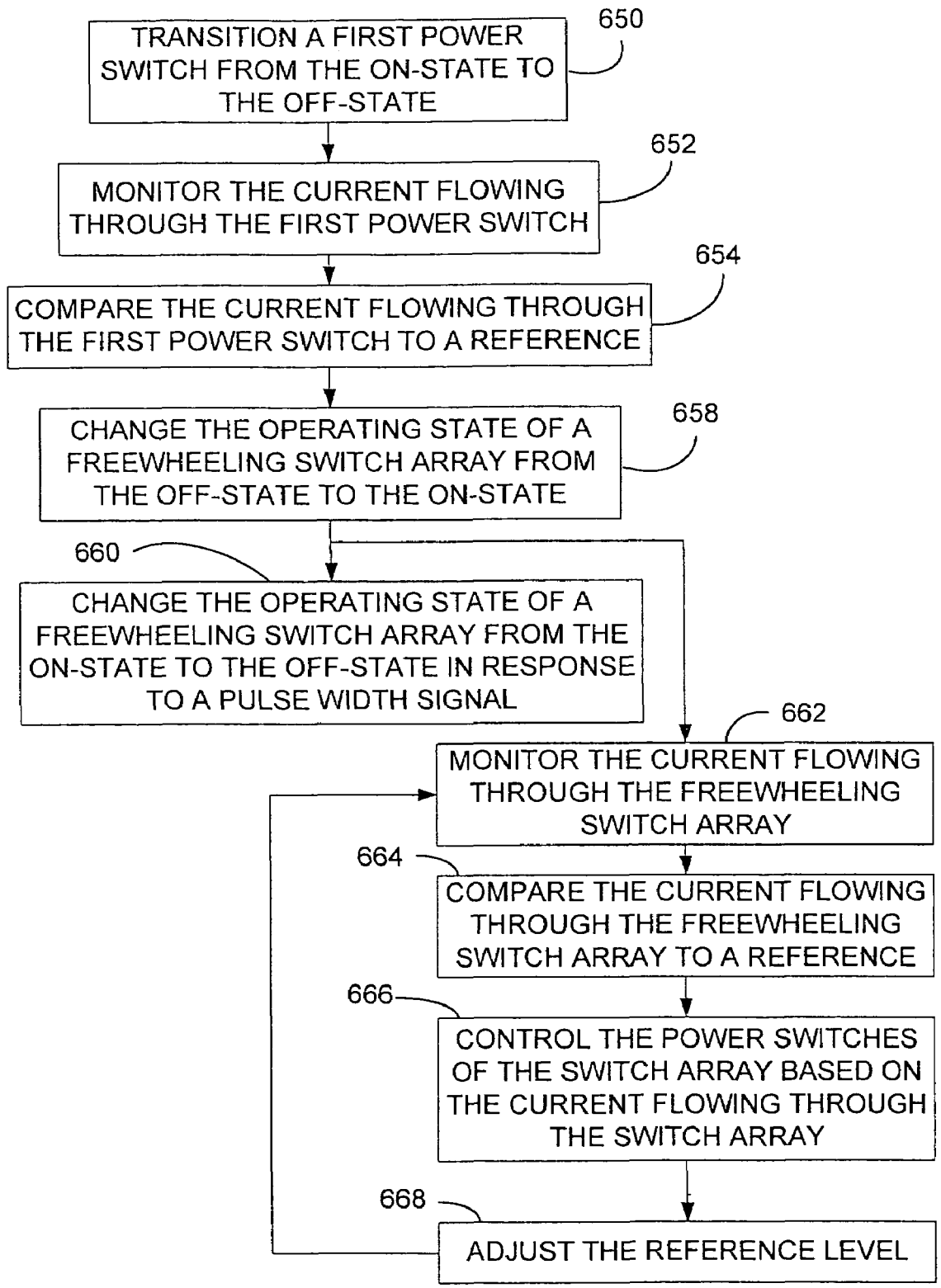
FIG. 18 is a flow diagram of an aspect of the operation of a diode emulation system.

FIG. 18 shows an aspect of the operation of the diode emulation system 600. At step 650, the first power switch 604 transitions from the on-state to the off-state. At step 652, the current flowing through the first power switch may be monitored. At step 654, the current flowing through the first power switch 604 may be compared to a reference level. At step 658, the operating state of a freewheeling switch array 602 may be changed from the off-state to the on-state. The freewheeling switch array 602 may be controlled as a function of a pulse width signal as well as the current flowing through either of the first power switch or the freewheeling switch array 602. For example, the power switches of the freewheeling switch array 602 may be switched to the on-state as the first power switch 604 is switched to the off-state based on a pulse width signal. In another aspect, if the current flowing through the first power switch 604 exceeds a predetermined limit, the freewheeling switch array 602 may be inhibited from changing operating state to the on-state. At step 660, the operating state of the freewheeling switch array 602 may be changed from the on-state to the off-state. In one aspect, the power switches of the freewheeling switch array 602 may be switched to the off-state as a function of the pulse width signal.

In another aspect, the power switches of the freewheeling switch array 602 may be sequentially switched to the off-state based on the current flowing through the freewheeling switch array 602. At step 662, the current flowing through the freewheeling switch array 602 may be monitored. At step 664, compare the monitored current to a reference level. At step 666, control individual ones of the power switches in the switch array 602 based on the amplitude of the current flowing through the switch array 602. For example, if the current flowing through the freewheeling switch array 602 exceeds the reference level, one or more of the power switches of the switch array 602 may be disabled. Sequentially controlling the power switches as the current decreases towards zero amps or increases from near zero amps, advantageously increases the impedance of node "A", thereby damping noise generation at node "A". At step 668, the reference level may be changed and operation may return to step 662 to continue.

Deadtime Control

Figure 19:
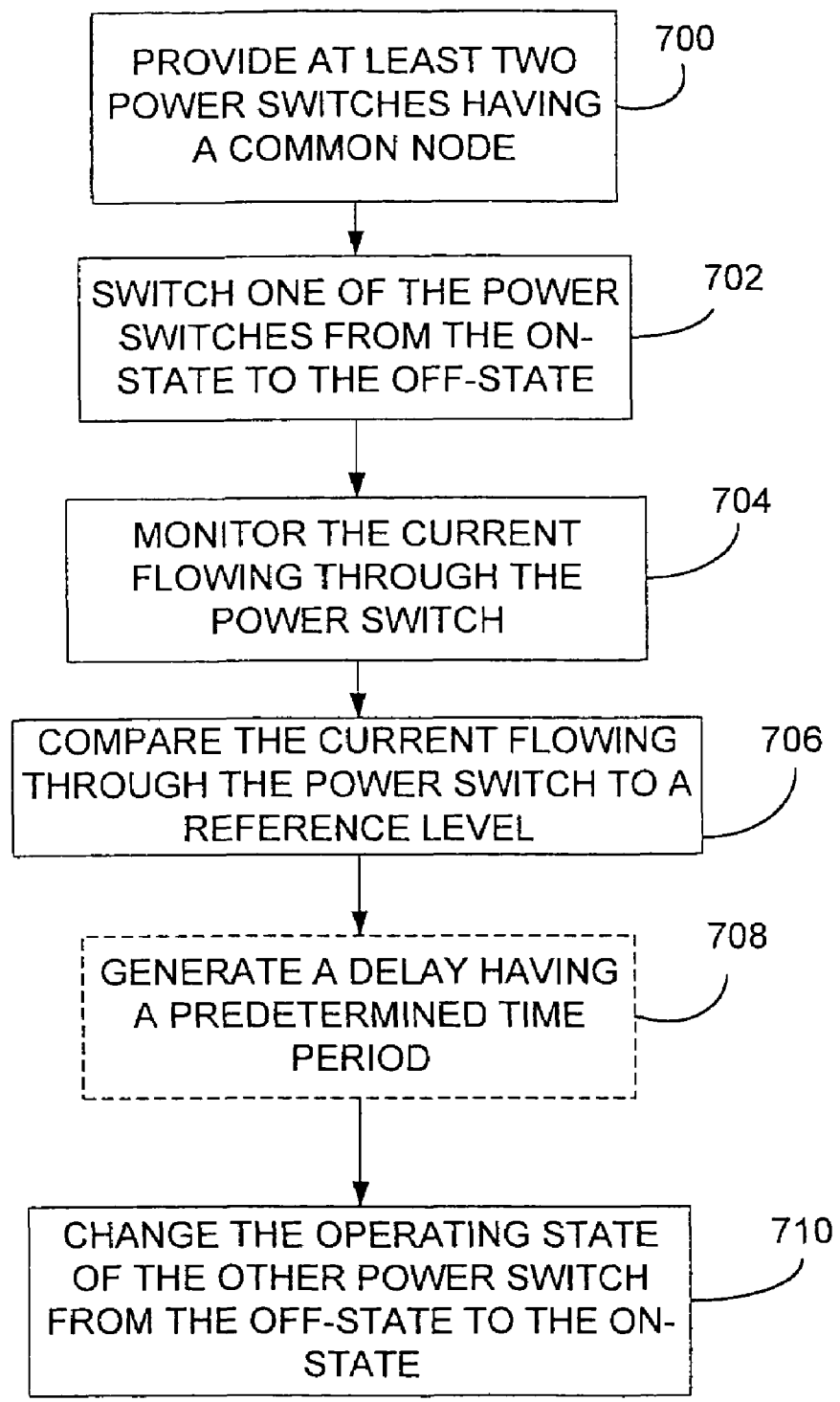
FIG. 19 is a flow diagram of an aspect of the operation of a deadtime control technique implemented with a diode emulation system.

FIG. 19 shows an aspect of the operation of a deadtime control technique implemented with the diode emulation system 600. At step 700, provide at least two power switches having a common node, where one of the power switches is a conducting power switch and the other power switch is a free-wheeling power switch. The conducting power switch conducts energy to an output of an output regulator during a conduction phase. The free-wheeling power switch conducts energy during a free-wheeling phase. Each of the power switches may be an array of power switches as well as a single switch. At step 702, switch one of the two power switches from the on-state to the off-state. At step 704, during the turn-off transition, monitor the current flowing through the power switch that has been turned-off. At step 706, compare the current flowing through the first power switch to a reference level. At step 708, a delay having a predetermined time period beginning when the current flowing through the power switch decreases to less than the reference level may be generated. At step 710, change the operating state of the other power switch from the off-state to the on-state.

Controlled Power Switch Losses

Figure 20:
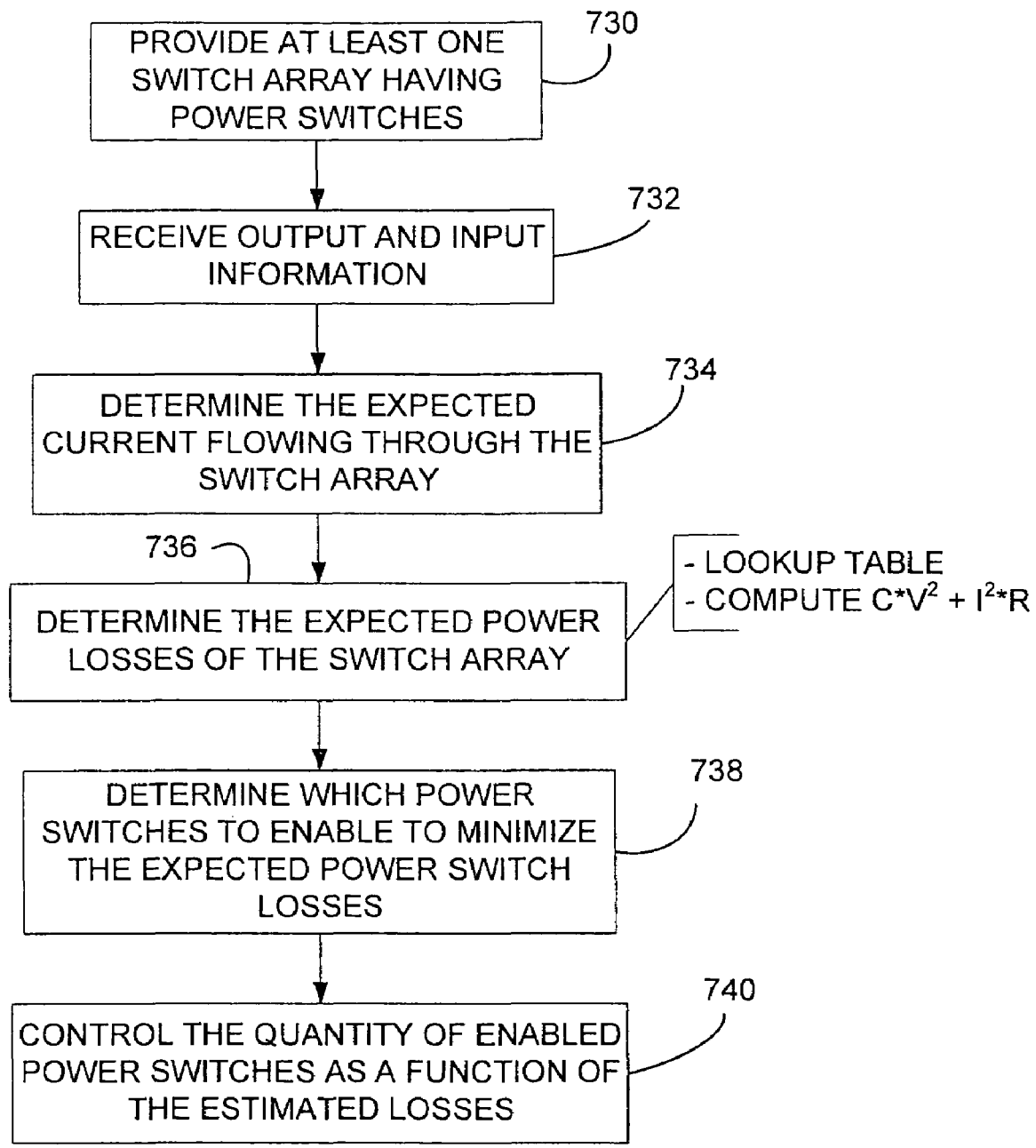
FIG. 20 is a flow diagram of an aspect of an operation for controlling losses in a power array.

FIG. 20 shows an aspect of an operation for controlling losses in a power array 500 of a power regulator. The power array 500 may include one or more switch arrays 502. At step 730, provide at least on switch array 502 having power switches to control the flow of current from an input source to an output. At step 732, output and input information may be received such as input voltage, output voltage, and output current. At step 734, the expected current flowing through the switch array 502 may be determined. The expected current may be determined using any information such as the output and input information, duty cycle information, and operating mode information. At step 736, the expected power losses of the switch array 502 may be determined. The expected power losses may include the conduction losses and switching losses of the power switches that are enabled. The switch array 502 may include two or more power switches of the same or differing sizes such as MOSFETs each having a different Rds(on). Different groupings of the power switches may be enabled to reduce the power losses of the switch array at specific operating conditions. For example, during a steady-state or transient light load operating condition, only one power switch having the highest Rds(on) may be enabled so that the switching losses associated with the switch array 502 may be minimized. Similarly, during a steady-state or transient maximum load operating condition, all of the power switches may be enabled to minimize the conduction losses of the switch array 502.

The expected power losses for the power switches may be determined using operating conditions such as Vds, Ids, and Rds(on) of the power switches to compute the expected power losses. The expected power losses may also be determined using a lookup mechanism such as a lookup table to estimate the expected power losses. The lookup mechanism may cross reference ranges of operating conditions to estimated power losses. The lookup mechanism may also indicate a preferred set of power switches to enable for particular operating conditions. The expected power losses may be determined on a cycle-by-cycle basis to obtain expected losses such as estimated losses and computed losses.

At step 738, the quantity and type of power switches to be enabled may be determined. The combination of power switches that minimize the expected power switch losses may be selected. The combination of power switches may be determined by computing the expected power losses for the switch array for several combinations of power switches. The combination of power switches may also be determined by using a lookup mechanism. At step 740, the selected combination of power switches may be enabled. The power switches may be controlled on a cycle-by-cycle basis so that during an operating phase of the power regulator such as the conduction phase and the free-wheeling phase, the quantity of power switches may be changed. For example, as current decreases in the power switches during a switching period of the power regulator, the quantity of power switches may be changed.

Noise Suppression

Figure 21:
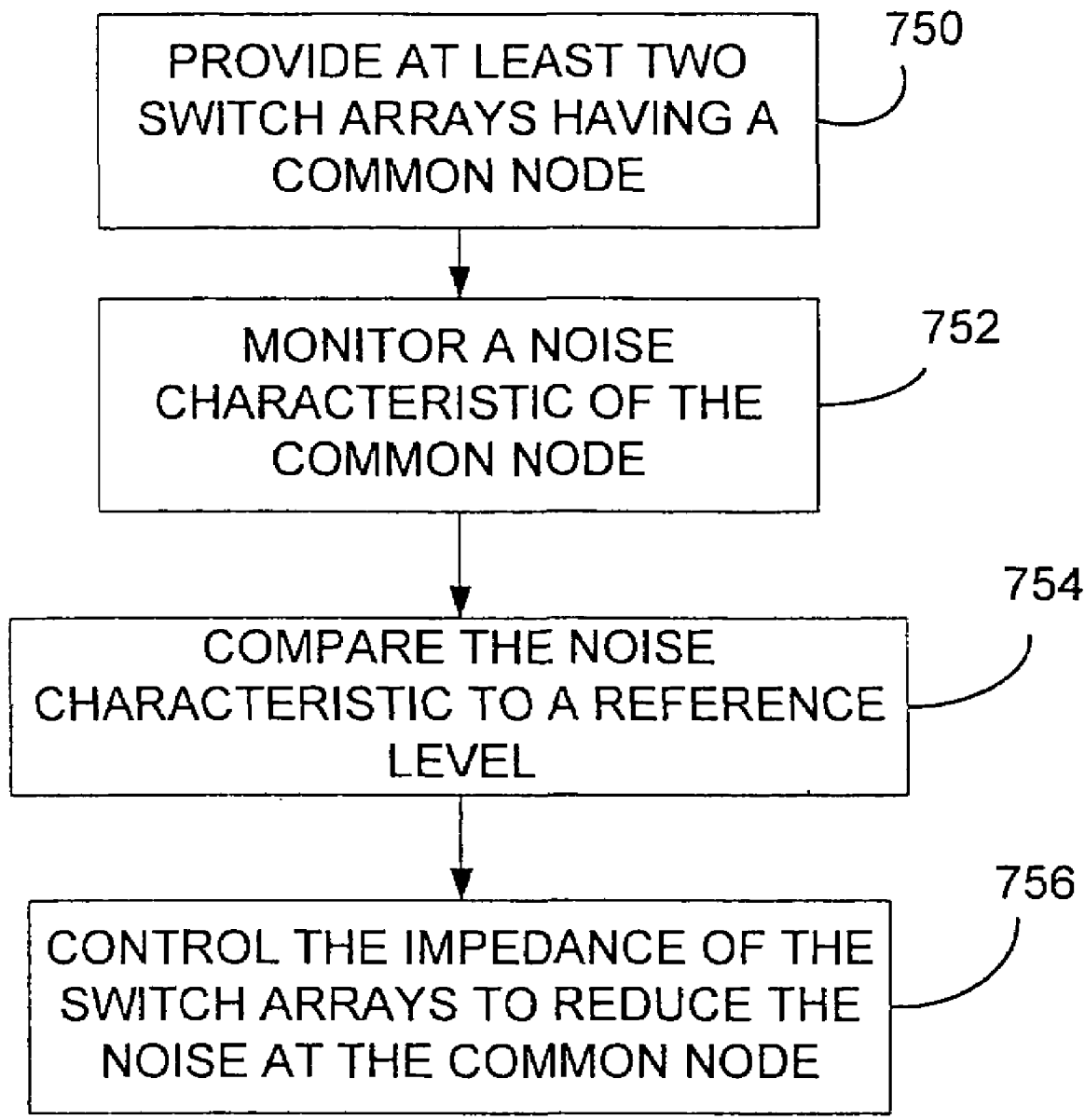
FIG. 21 is a flow diagram of an aspect of an operation for suppressing the generation of noise by a power stage of a power regulator.

FIG. 21 shows an aspect of an operation for suppressing the generation of noise by a power stage of a power regulator. The power stage may include at least two switch arrays having a common node, step 750. The switch arrays may be arranged in any topology such as buck, boost, sepic, and zeta. Each of the switch arrays may include one or more power switches connected in parallel and individually controlled so that the quantity of switches that conduct within each switch array may be controlled on a cycle-by-cycle basis. The power switches are preferably MOSFETs, however any type of power switch having a variable output capacitance may be used such as BJTs, IGBTs, and MCTs. Controlling the quantity of power switches that conduct within each switch array causes the impedance of the common node to be controlled. An exemplary operation may include an upper switch array and a lower switch array connected in a buck configuration where the upper switch array operates during a conduction phase and the lower switch array operates during a free-wheeling phase. At step 752, a noise characteristic of the common node, such as voltage and current, may be monitored. At step 754, the noise characteristic may be compared to one or more reference levels to generate an impedance control signal. At step 756, the switch arrays may be controlled in response to the impedance control signal. For example, an upper switch array having four power switches in parallel may be operated so that the four power switches are sequentially turned-off one-by-one so that the impedance of the common node may change from a low impedance to a high impedance over a controlled time period, thereby damping noise spikes occurring during the switch transition.

Controlled Capacitance

Figure 22:
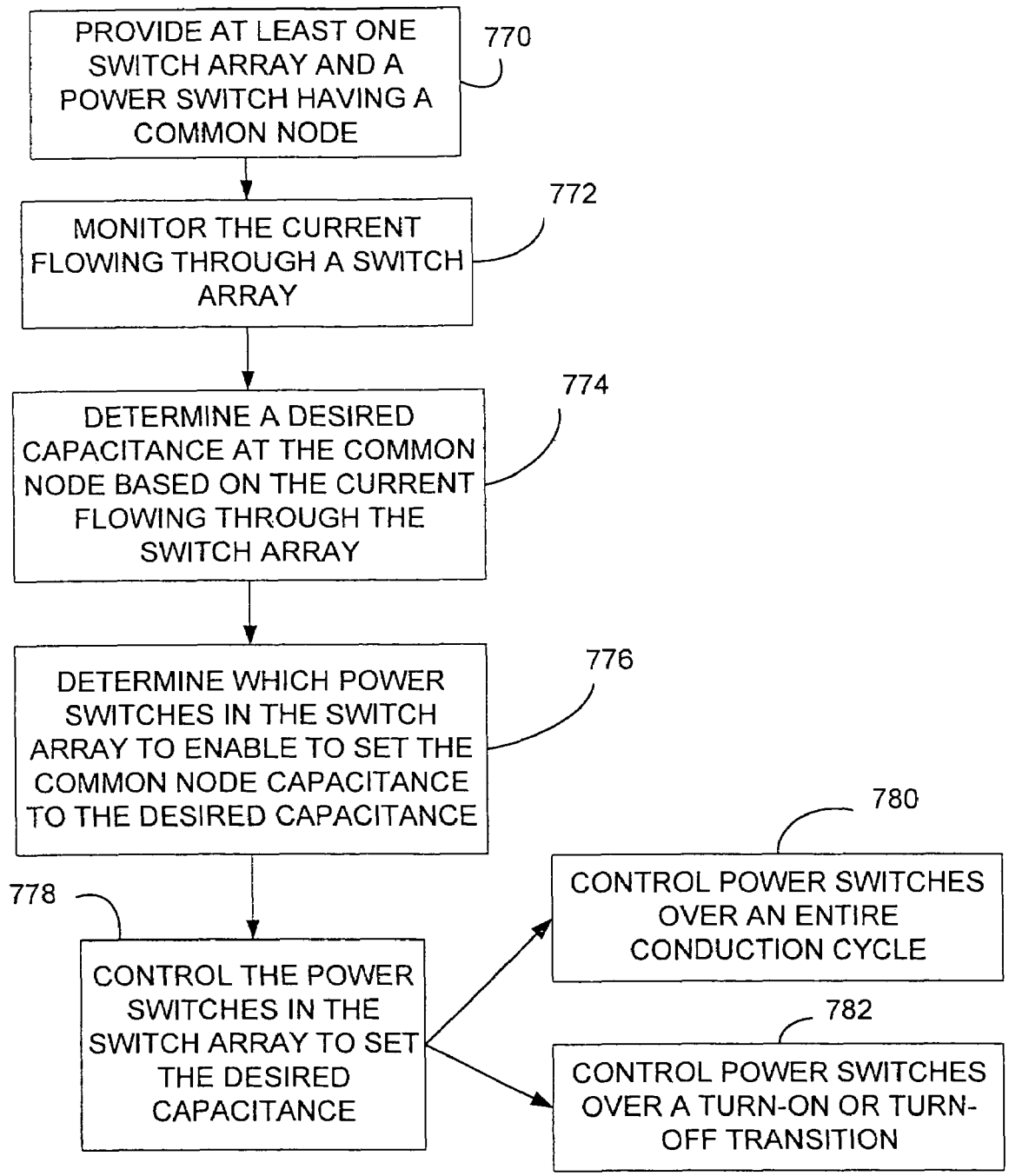
FIG. 22 is a flow diagram of an aspect of an operation for controlling a capacitance of a circuit node of an output regulator.

FIG. 22 shows an aspect of an operation for controlling a capacitance of a circuit node of an output regulator. The output regulator may include a power stage having at least one switch array connected to a first switch to convert an input source to a regulated output. The switch array may be connected to the first switch through a common node, step 770. The switch array may include two or more cascode connected power switch pairs connected in parallel and individually controlled so that the quantity of power switches that conduct within the switch array may be controlled on a cycle-by-cycle basis. The first switch pair may be a single cascode connected power switch pair as well as a switch array of cascode connected power switch pairs. The power switch pairs may be any type of cascode connected power switches having a variable output capacitance such as MOSFETs with BJTs, MOSFETs with IGBTs, and MOSFETs with MCTs. Controlling the capacitance of the common node may be particularly advantageous in resonant mode, soft switching, and quasi-resonant mode switching regulators. For example, controlling the capacitance of the common node in a fixed frequency soft switching regulator may control the resonance of the power switches over increased input voltage and output load ranges. At step 772, monitor the current flowing through a switch array. The switch array current may be monitored directly or indirectly such as by monitoring the output current of the output regulator. At step 774, determine a desired capacitance at the common node based on the current flowing through the switch array. The desired capacitance may be selected to be the capacitance that the switch array current will resonate to a predetermined voltage across Vds of the switch array. For example, in a soft-switching converter at turn-on the current flowing through a power switch may resonate the capacitance of the power switch to zero volts to reduce switching losses. In this example, the capacitance may be controlled so that the current flowing through the switch array is sufficient to resonate the Vds of the switch array to a predetermined voltage level, thereby reducing switching losses. At step 776, the combination of power switches in the switch array to enable is determined. Each power switch has an associated output capacitance that may form a portion of the capacitance at the common node. By enabling selected power switches in the switch array, the total capacitance at the common node may be controlled. The capacitance associated with each Using a switch array for the first switch may increase the range over which the capacitance of the common node may be controlled. At step 778, the power switches in the switch array are controlled to generate the desired capacitance at the common node. At step 780, selected ones of the power switches may be enabled/disabled over an entire conduction cycle so that the capacitance at the common node remains constant over the entire conduction cycle. At step 782, the power switches may also be sequentially turned-on or turned-off to control the capacitance of the common node.

Delay Line

Figure 23:
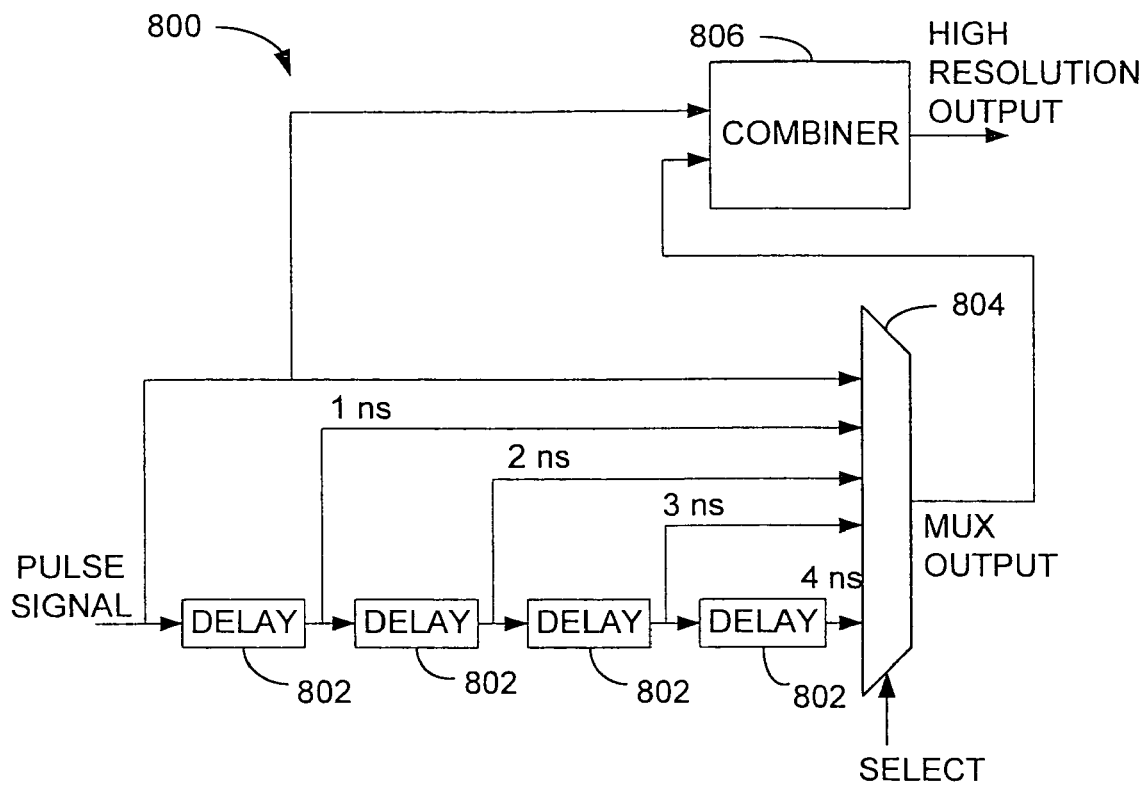
FIG. 23 is a block diagram of an aspect of a delay line for generating a delay in a pulse signal.
Figure 24:
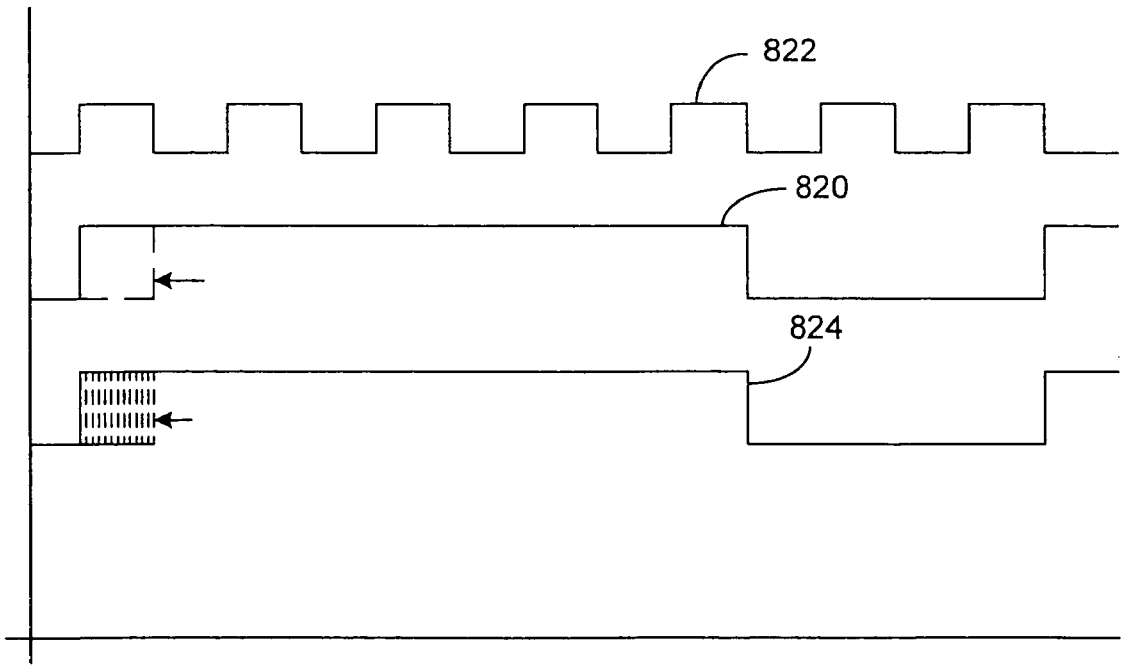
FIG. 24 is a timing diagram of waveforms associated with an aspect of a delay line.

FIG. 23 shows an aspect of a delay line 800 for generating a delay in a pulse signal. The delay line 800 is particularly suitable for delaying an edge of a pulse signal generated in a digital control system for an output regulator to increase the resolution of pulse signal. Any type of delay line may be used such as interpolator and delay lock loops. FIG. 24 shows an exemplary pulse signal 820 in a digital control system. The digital control signal may include a clock signal 822 for generating digital signals such as the pulse signal 820. The pulse width of the pulse signal 820 may set the conduction time for an output regulator. A regulated output of the output regulator may be maintained within regulation limits by varying the pulse width of the pulse signal. The error in regulating the regulated output may be related to the pulse width resolution of the pulse signal which is limited by the frequency of the clock signal 822. The maximum pulse width resolution may be limited to increments that are equal to or greater than the pulse width of the clock signal 822. The limited pulse width resolution may cause an increase in error corresponding to the ratio of the maximum pulse width resolution to the time of period of the desired pulse width.

The delay line 800 may advantageously reduce the pulse width error by increasing the pulse width resolution. The delay line 800 may include several delay circuits 802 to generate several delayed edges of the pulse signal 820. The delay circuits 802 may be arranged in any configuration such as a series configuration, a parallel configuration, and a series-parallel configuration. Any type of relationship of the time periods of the delay circuits 802 may be any used such as equal, binary, and exponential. Any quantity of delay circuits 802 may be used, although the quantity preferably ranges from 4 to 40. The greater the quantity of delay circuits, the greater the improvement in the pulse width resolution. The outputs of the delay circuits 802 may be input to a multiplexor 804 for selecting a delay. A combiner 806 may combine the selected delay with the pulse signal to generate a high resolution output. The DLL 800 is shown and described as delaying the leading edge of the pulse signal. However, the delay line 800 may also delay the trailing edge of the pulse signal.

Figure 25:
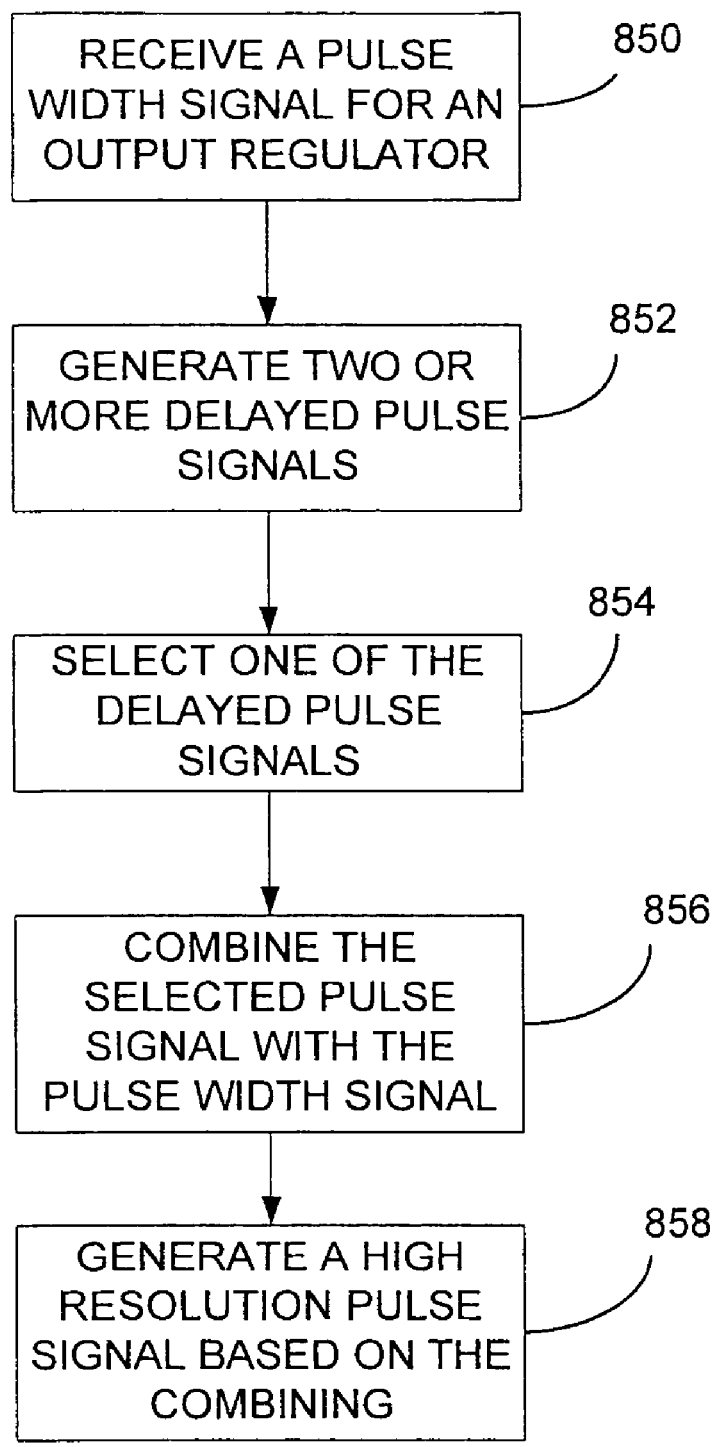
FIG. 25 is a flow diagram of an aspect of an operation for increasing the resolution of a pulse width signal for an output regulator.

FIG. 25 shows an aspect of an operation for increasing the resolution of a pulse width signal for an output regulator. At step 850, receive a pulse width signal for an output regulator. At step 852, generate two or more delayed pulse signals from the pulse width signal. At step 854, select one of the delayed pulse signals to obtain a desired delay time. The selection may be based on selecting the delayed pulse signal that represents the pulse width error so that combining the delayed pulse signal with the pulse width signal reduces the error of the pulse width signal. At step 856, combine the selected pulse signal with the pulse width signal. At step 868, generate a high resolution pulse signal based on the combining.

Adaptive Duty Cycle Limit

Figure 26:
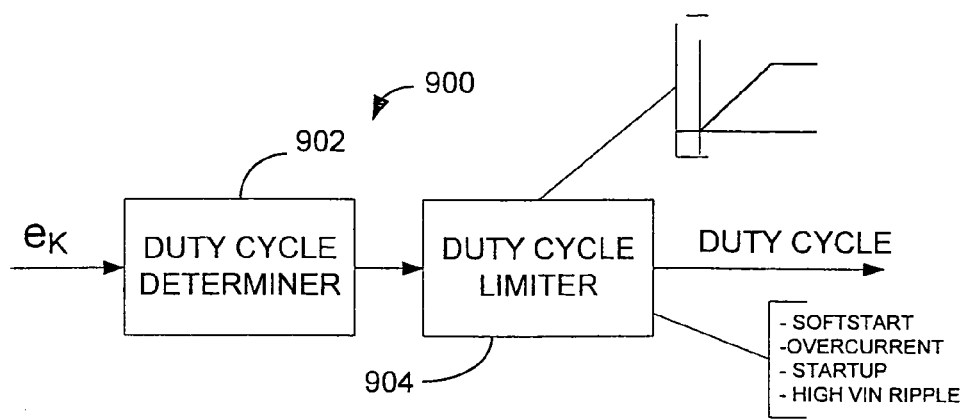
FIG. 26 is a block diagram of an aspect of a digital controller for determining a duty cycle for a switching regulator.

FIG. 26 shows an aspect of a digital controller 900 for generating a duty cycle signal to operate an output regulator. A duty cycle determiner 902 may receive a digital error signal $e_k$ that is a function of an output error between a reference and an output of the output regulator. In one aspect, the error signal $e_k$ may indicate one of several ranges of voltages within which the output error is included. For example, the error signal may indicate the output error lies within the voltage range including voltages from 0.5 volts to 0.8 volts. In another aspect, the error signal may indicate the amplitude of the output error. The error signal $e_k$ may be any type of signal such as digital signals and analog signals.

The duty cycle determiner 902 may generate a nominal duty cycle signal as a function of the error signal $e_k$. The duty cycle determiner 902 may receive additional digital inputs such as error signals from secondary loops, voltage and current state information of the output regulator. The nominal duty cycle signal may be any type of digital signal for representing the duty cycle such as a pulse signal with a controlled pulse width and a digital signal of one or more bits such as a multibit digital signal.

A duty cycle limiter 904 may limit the transfer of energy to the output as a function of a regulator characteristic of the input or output power such as Vin, the input ripple voltage, $V_{Inripple}$ the input current, Iin, the input power, Pin, the input energy, Qin, the input source impedance, Rs, the output power, Po, the output voltage, Vo, and, the output current, Io. The duty cycle limiter 904 may control the duty cycle to limit the transfer of energy to the output. The duty cycle limiter 904 may operate during all phases of operation of the output regulator such as steady-state operation, start-up, overcurrent, and overvoltage. The duty cycle limiter 904 may compare one or more of the input/output regulator characteristics to corresponding threshold values and then limit the duty cycle as a function of the comparing. The duty cycle limiter 904 may operate on a cycle-by-cycle basis at the sampling frequency or lower to control the threshold values. Each cycle, the duty cycle limiter 904 may change the threshold value and limit the duty cycle for the next cycle. The duty cycle for the next cycle may be determined based on comparing the input power regulator characteristic of the previous cycle to the threshold value. For example, the duty cycle limiter 904 may monitor Iin and generate a digital signal to limit the duty cycle so that the amplitude of Iin does not exceed a threshold value. In another example, the duty cycle limiter 904 may determine the input source impedance or may receive a signal indicating the input source impedance and in response, the duty cycle limiter 904 may generate a digital signal to limit the duty cycle. Any method of measuring the input source impedance may be employed.

Duty Cycle Estimation

Figure 28:
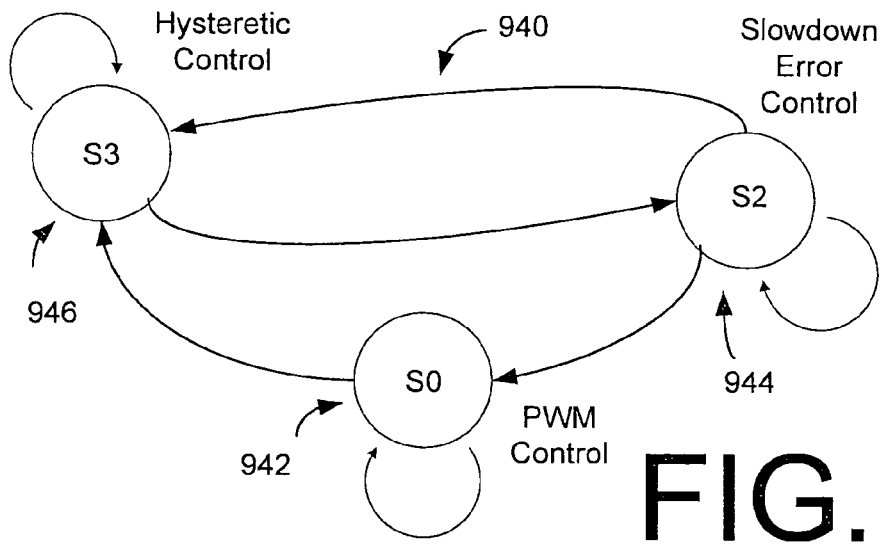
FIG. 28 is a state diagram of an aspect of a duty cycle estimator.

FIG. 27 shows an aspect of a digital controller 950 for controlling a switching regulator. FIG. 28 shows an aspect of a state diagram 940 implemented in the digital controller 950 for generating a duty cycle signal to operate the switching regulator. The state diagram 940 may include three or more operating states. In the exemplary digital controller 950, a State S0 942 may implement PWM Control for stable state conditions. A State S2 944 may implement slowdown error gradient control for transient state conditions. A State S3 946 may implement hysteretic control for maximum error conditions.

The digital controller 950 may include a duty cycle estimator 952 to generate nominal duty cycle signals, Up* and Down*, that correspond to nominal steady-state values from which to generate a current duty cycle for the switching regulator. The duty cycle estimator 952 may be used for generating nominal duty signals in all of the operating states such as PWM and slowdown error control. However, the duty cycle estimator 952 is preferably not used for the hysteretic control operating state. During hysteretic control, the duty cycle may be directly related to the error signal so that when the error signal is in one state the duty cycle is set to the ON state (up), and when the error signal is in the other state the duty cycle is set to the OFF state (down). The duty cycle estimator 952 may generate the nominal duty cycle signals as a function of input signals such as an error signal, a UD pulse, and a delay control. Power switches in the switching regulator may be operated at the current duty cycle to control the conversion of energy from an input source to an output load. For example, in a switching regulator having a buck topology and fixed frequency operation, the nominal duty cycle signal Up* may be approximately equal to a value that corresponds to the ratio of the output voltage to the input voltage. During fixed frequency operation, the combination of the nominal steady-state values may correspond to the total switching period of the switching regulator such as 1 usec for a 1 MHz switching frequency.

An adjust determiner 954 may determine an adjustment value, ADJ, to combine with the nominal duty cycle signals to generate adjusted duty cycle signals, Up and Down. The adjust determiner 954 may generate the adjustment value as a function of the error signal as well as other signals from the switching regulator. The adjust determiner 954 may generally be used for all of the operating states except hysteretic control. Since in the hysteretic control operating state, the duty cycle is either 100% ON or 100% OFF, no adjustment value is required. In one aspect, the adjustment value for the PWM state 942 and the slowdown error control state 944 may be computed as follows:

$$ADJ_K = G(e_k) + h(\text{trend}_k)$$

$$Up_k = Up^* - ADJ_k * FAC^{on}$$

$$Down_k = Down^* + ADJ_k * FAC^{off}$$

where FAC may be determined based on the nominal duty cycle, $$g(e_k) = \begin{cases} 0 & \text{if } |e_k| < A1 \\ \text{sign}(e_k) * \Delta & \text{if } A1 \le |e_k| < A2 \\ \text{sign}(e_k) * \Delta & \text{if } A2 \le |e_k| < A3 \end{cases}$$

$$h(trend_k) = \begin{cases} 0 & \text{if } |trend_k| < 1 \\ trend_k & \text{if } |trend_k| \ge 1 \end{cases}$$

$$trend_k = F_{slope} * e_k - e_{k-n}$$

Where $F_{slope}$ is a constant, $\overline{e_k - e_{k-n}}$ is an average of the error from the "n" prior cycles where "n" is the number of samples in a switching period, and A1, A2, and A3 are defined in FIG. 29 which shows voltage levels of a voltage slicer for generating the error signal.

$\Delta_1$ and $\Delta_2$ are loop gains which may be selected at the sampling rate and may have values based on the amplitude of the error signal. The values of the loop gains, $\Delta_1$ and $\Delta_2$ may be selected to be related such as $\Delta_2$ being approximately equal to two times $\Delta_1$. The loop gain of the digital controller may be changed adaptively at any rate up to and including the sampling rate. Each of the loop gains may be dynamically changed as a function of any parameter of the output regulator such as the voltage range of the error signal, the voltage range of the regulated output, and the duty cycle.

The loop compensation of the digital controller may include the ratio of $g(e_k)$ to $h(trend_k)$. The loop compensation may be changed adaptively at any rate up to and including the sampling rate. In one aspect, the constant $F_{slope}$ may be adaptively changed to change the loop compensation. The loop compensation may be dynamically changed as a function of any parameter of the output regulator such as the voltage range of the error signal, the voltage range of the regulated output, and the duty cycle.

A combiner 956 may combine the nominal duty cycle signals with the adjustment value to generate the adjusted duty cycle signals. In one aspect, the adjusted duty cycle signals may be used as counter limits for generating a UD pulse.

n this case, a counter 958 may generate the UD pulse as a function of a clock signal, CLOCK, and the adjusted duty cycle signals. The UD pulse preferably has an "on" level and an "off" level and may have a varying pulse width to represent an on-time for driving the power switches of the switching regulator. The counter 958 may count a quantity of clock cycles set by the counter limits to generate the "on-time" and "off-time" of the UD signal. For example, the Up portion of the adjusted duty cycle signal may set the counter limit for the on-time and the Down portion of the adjusted duty cycle signal may set the counter limit for the off-time. Preferably, a single counter generates the UD signal in response to a single counter limit signal including both the Up and Down information. The UD pulse may include a quantization error related to the pulse resolution being limited by the frequency of the clock signal. FIG. 30 shows an example of quantization error in which a UD pulse 970 that is generated from a clock signal 972 and an adjusted duty cycle signal 974 may have a quantization error 976 related to the frequency of the clock signal.

A delay line 960 may finetune the UD pulse generated by the counter 958 to reduce the quantization error. The delay line 960 may, in response to receiving the UD pulse and a delay control signal, generate a finetune pulse signal having a duty cycle that approximates the pulse width corresponding to the adjusted duty cycle signals. The delay line 960 may delay either edge of the UD pulse to generate the finetune pulse signal. For example, in one aspect the UD pulse may be generated having a pulse width shorter than the corresponding adjusted duty cycle, and then the delay line 960 may delay the trailing edge to generate the finetune pulse signal. In another aspect, the UD pulse may be generated having a pulse width longer than the corresponding adjusted duty cycle, and then the delay line 960 may delay the leading edge to generate the finetune pulse signal.

A control block 962 may generate the delay control signal as a function of the UD pulse and the adjusted duty cycle signals. The delay control signal may preferably be a multi-bit signal.

A duty cycle limiter 964 may limit the transfer of energy to the output as a function of an electricalcharacteristic of the switching regulator such as Vin, the input current, Iin, the input power, Pin, the input energy, Qin, and an inductor current; $I_L$. The duty cycle limiter 964 may control the duty cycle to limit the transfer of energy to the output. The duty cycle limiter 964 may be included anywhere in the digital controller 950. In one aspect, the duty cycle limiter 964 may operate on a multi-bit signal such as the adjusted duty cycle signals. In another aspect, the duty cycle limiter 964 may operate on a pulse signal such as the finetune pulse signal.

Figure 31B:
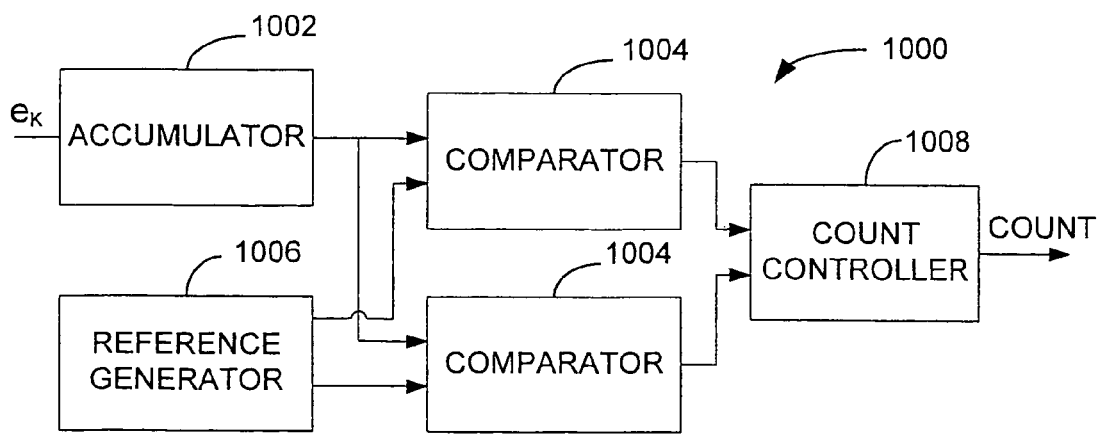
FIG. 31B is a block diagram of an aspect of another duty cycle estimator for determining a duty cycle for a switching regulator.
Figure 31A:
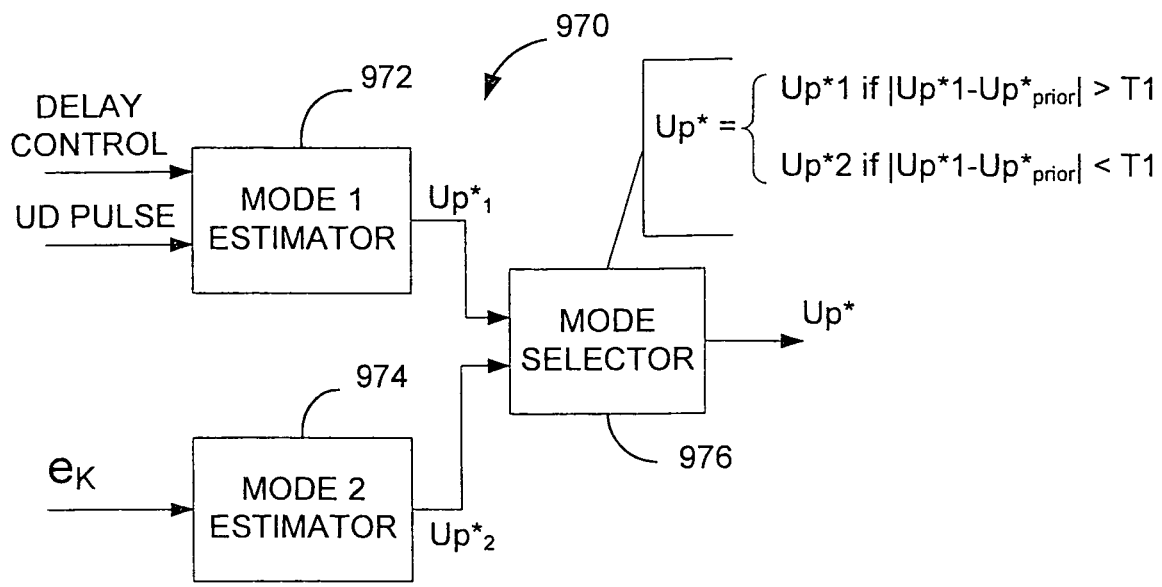
FIG. 31A is a block diagram of an aspect of a duty cycle estimator for determining a duty cycle for a switching regulator.

FIG. 31A shows an aspect of a duty cycle estimator 970 for generating nominal duty cycle signals, Up* and Down*, from which a current duty cycle for operating the switching regulator may be generated. The duty cycle estimator 970 may include one or more modes for determining the nominal duty cycle.

A mode 1 estimator 972 may determine the nominal duty cycle signals as a function of the on-time (up-time) of the current duty cycle and prior duty cycle values. The mode 1 estimator 972 may apply any estimating technique, such as a least mean squares technique or a cubic splines technique, to the current duty cycle and prior duty cycle values to determine the nominal duty cycle. In one aspect, the mode 1 estimator may evaluate the delay control and the UD pulse to determine the on-time. A predetermined quantity of current and prior duty cycle values may be used to estimate the nominal duty cycle.

A mode 2 estimator 974 may determine the nominal duty cycle signals as a function of the error signal. The mode 2 estimator 974 may determine a mathematical function of the error over several cycles such as any quantity greater than the switching period of the switching regulator. Any type of mathematical function may be used such as a running average, a mean, and a weighted average. The mathematical function of the error may be compared to one or more references. Then based on the comparison, the Up* may be increased, decreased, or maintained constant.

FIG. 31B shows an exemplary mode 2 estimator 1000. An accumulator 1002 may compute a running average of the error over a time period approximately equal to 1000 times the switching period of the switching regulator. One or more comparators 1004 may compare the output of the accumulator 1002 to two references, X1 and X2, which may be generated by a reference generator 1006. A count controller 1008 may control the count of the nominal duty cycle based on the outputs of the comparators 1004. For example, if the running average is greater than X1, the count controller 1008 may decrease the Up* count by one step. If the running average is less than X2, the count controller 1008 may increase the Up* count by one step. If the running average is less than X1 and greater than X2, then the count controller 1008 may maintain the Up* count unchanged.

Computing a mathematical function of the error over a long time period may provide a slow and accurate estimation of the nominal duty cycle. In addition, the transfer function of the control loop for controlling the regulated output of the switching regulator may reduce to a single zero, thereby reducing the phase shift associated with the digital controller. The reduced phase shift may be used to increase the phase margin of the control loop, increase the loop crossover frequency, and combinations of increased phase margin and increased loop crossover frequency. During the time period during which the mode 2 estimator 974 generates a constant Up* value, the control loop reduces to a single zero.

A mode selector 976 may select between the modes of the duty cycle estimator 970 on the basis of a mode selection criteria. In one aspect, the mode selector 976 may select between $UP^*_1$ and $UP^*_2$ on the basis of the difference between $UP^*_1$ and $Up^*_{prior}$, as follows:

$$Up^* = \begin{cases} Up^*_1 & \text{if } |Up^*_1 - UP^*_{prior}| > T1 \\ Up^*_2 & \text{if } |Up^*_1 - UP^*_{prior}| < T1 \end{cases}$$

where $UP^*_1$ is the up value generated by the mode 1 estimator 972, $UP^*_2$ is the up value generated by the mode 2 estimator 974, and $Up^*_{prior}$ is the UP* value for the prior cycle, and T1 may be approximately 5 nsec for a switching frequency of 1 MHz.

Any mode selection criteria may be employed such as comparing $UP^*_1$ to a running average of $UP^*_{prior}$ and comparing a running average of $UP^*_1$ to $Up^*_{prior}$. Also, any value may be selected for T1.

Figure 32:
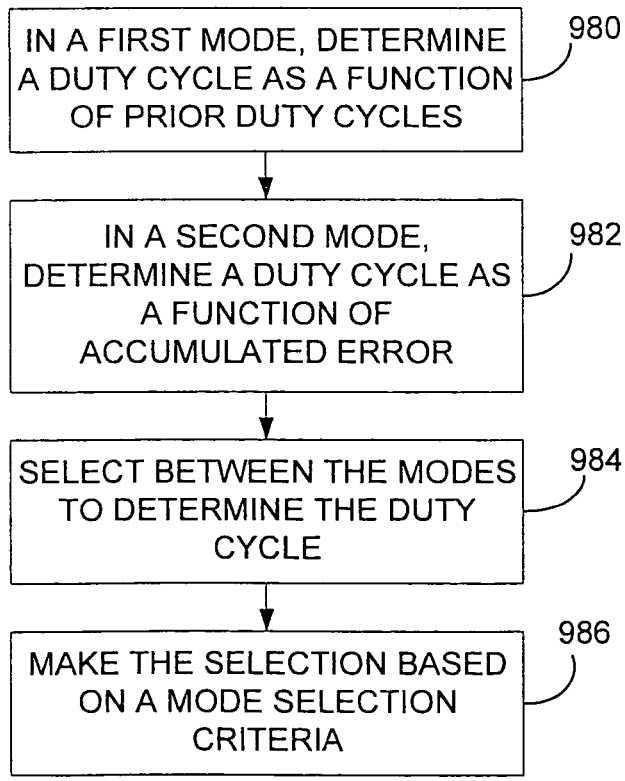
FIG. 32 is a flow diagram of an aspect of an operation for generating a duty cycle for a switching regulator.

FIG. 32 shows an aspect of an operation for determining a duty cycle for a switching regulator. At step 980, in a first mode determine the nominal duty cycle as a function of prior duty cycles. At step 982, in a second mode determine the nominal duty cycle as a function of accumulated error. At step 984, select between the two modes to compute the nominal duty cycle. At step 986, make the selection based on a mode selection criteria such as the rate of change of the computed duty cycle.

Energy Saving Discontinuous Mode Control

Figure 33:
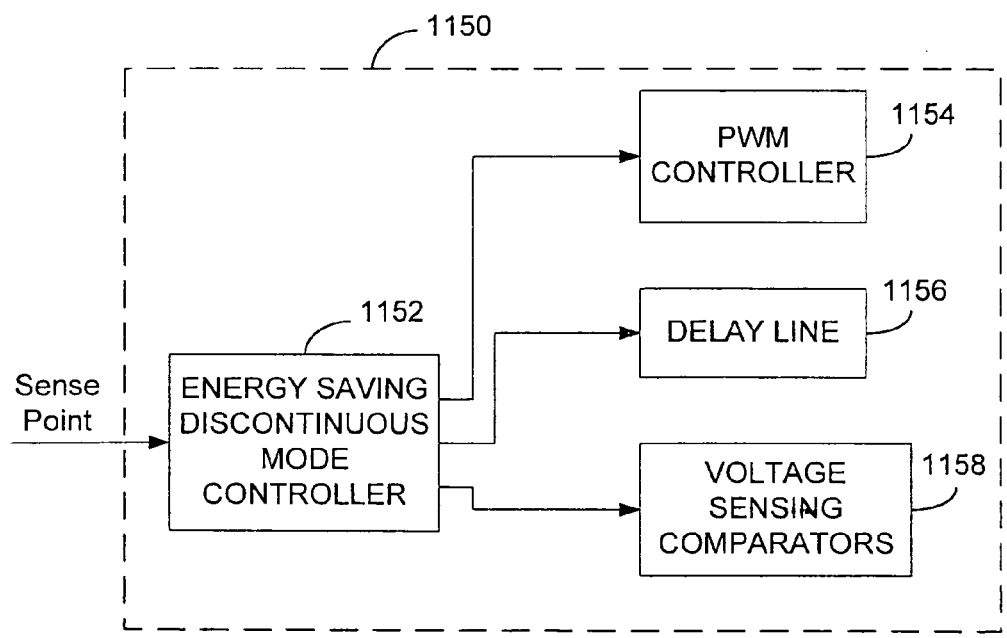
FIG. 33 is a block diagram of an aspect of a digital controller including an energy saving discontinuous mode (ESDM).

FIG. 33 shows an aspect of a digital controller 1050 including an Energy Saving Discontinuous Mode to control power consumption of the digital controller 1050. The digital controller 1050 may include some or all of the functions described throughout this specification.

An Energy Saving Discontinuous Mode (ESDM) controller 1152 may monitor a sense point such as an output voltage, an inductor current, or an output voltage to determine when to switch to Energy Saving Discontinuous Mode. The parameter monitored at the sense point may reflect a power state of the output regulator such as low output power or discontinuous current in an inductor. The ESDM controller may for example, switch to energy saving discontinuous mode when the output current is less than a predetermined amplitude or when current flowing through the output inductor becomes discontinuous. The ESDM controller 1152 may advantageously control the flow of power to portions of the control functions of the digital controller 1150. Control functions within the digital controller 1050 such as a PWM controller 1154, a delay line 1156, and voltage sensing comparators 1158 may be shutdown during energy saving discontinuous mode to reduce power consumption.

Figure 34A:
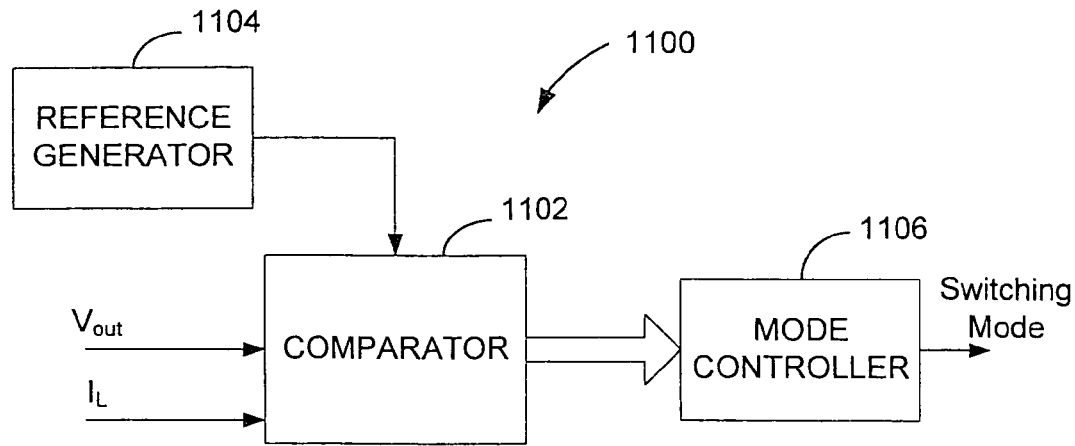
FIG. 34A is a block diagram of an aspect of a digital controller for controlling the switchover between constant current mode and discontinuous current mode.
Figure 34B:
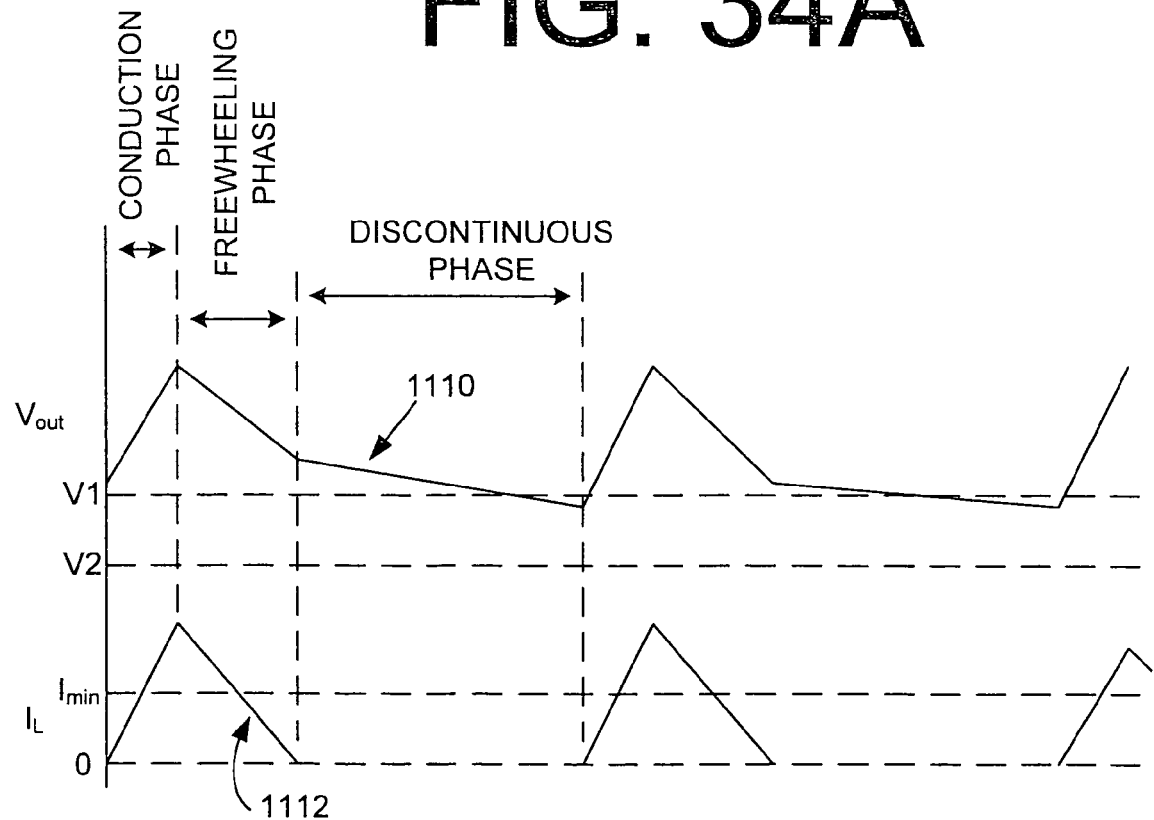
FIG. 34B is a timing diagram of waveforms associated with an aspect of a digital controller.

FIG. 34A shows an aspect of a digital controller 1100 for controlling the transition between switching modes of an output regulator. Specifically, the digital controller 1100 may control switching between continuous current mode (CCM) operation and discontinuous current mode (DCM) operation. FIG. 34B shows waveforms associated with DCM operation. A first waveform, Vout, 1110 shows a regulated output voltage of the output regulator. A second waveform shows an inductor current, IL, 1112 of the output regulator. During DCM, the regulated output voltage 1110 and the inductor current 1112 operate in three phases; a conduction phase, a freewheeling phase, and a discontinuous phase. During the conduction phase, energy from an input source is conducted to the output filter causing the inductor current 1112 to ramp up transferring energy to the regulated output (load) leading to an increase in the regulated output voltage 1110. During the freewheeling phase, energy stored in the inductor is transferred to the regulated output causing the inductor current 1112 and the regulated output voltage 1110 to ramp down. During the discontinuous phase, all of the energy in the inductor has transferred to the regulated output so the inductor current may remain at approximately zero and energy is transferred from an output capacitor to supply energy to the regulated load.

The digital controller 1100 may include one or more comparators 1102 to determine when to switch between CCM and DCM. In one aspect, the comparators 1102 may compare the regulated output voltage 1110 and the inductor current 1112 to reference levels to generate control signals for controlling the switching between CCM and DCM.

One or more reference generators 1104 may generate the reference levels. Any type of reference generator 1104 may be employed. The reference generator 1104 may generate a reference level V1 for shifting the sensed regulated output voltage. A reference level V2 may be used for comparing to the shifted regulated output voltage 1110 to control the DCM to CCM transition. A reference level I1 may be generated to reflect a predetermined current such as the minimum load current. The inductor current 1112 may be compared to I1 to determine a percentage of time that the inductor current is less than I1.

A mode controller 1106 may control the switching mode as a function of the comparator outputs. In one aspect, the mode controller 1106 may control the CCM to DCM switchover based on the percentage of time that the inductor current is less than I1. In another aspect, the mode controller 1106 may control the CCM to DCM switchover based on the sensed output voltage rising to a level greater than V1. In DCM, the mode controller may set the on-time to a constant and regulate the regulated output by varying the switching frequency of the output regulator.

To control the DCM to CCM switchover, the digital controller 1100 may, when switching to DCM, shift the sensed regulated output voltage to above the reference level V1. Then, as the output load current increases, the waveform of the sensed regulated output voltage changes shape and a portion of the waveshape moves towards the reference level V2. The comparator 1102 may compare the shifted regulated output voltage to the reference level V2 and indicate when the shifted regulated output voltage is approximately less than or equal to the reference level V2. The mode controller 1106 may, in response to the output of the comparator 1102, switch the switching mode from DCM to CCM.

Figure 35:
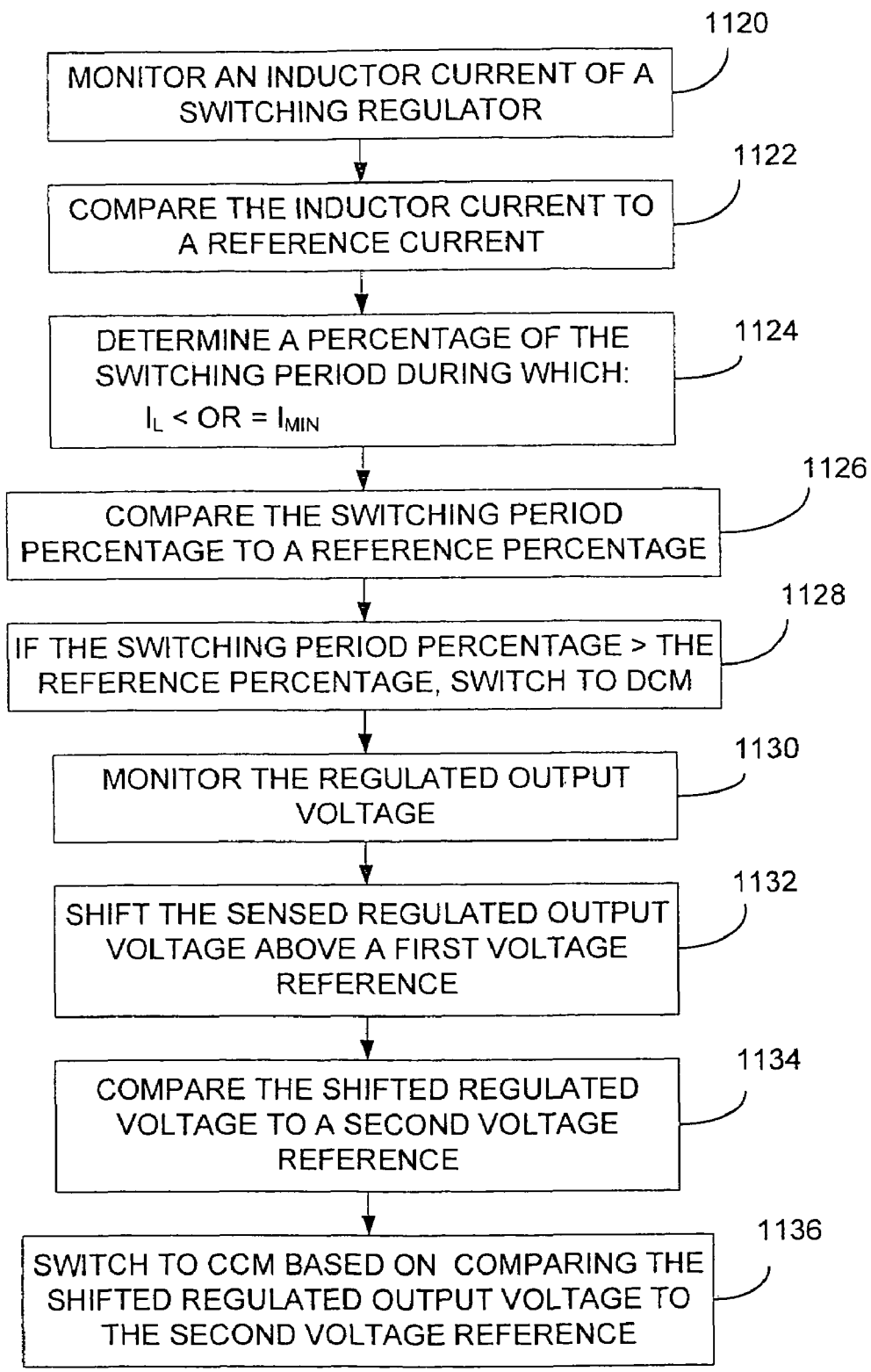
FIG. 35 is a flow diagram of an aspect of an operation for controlling the switchover between constant current mode and discontinuous current mode.

FIG. 35 shows an aspect of the operation of switching mode control. At step 1120, monitor an inductor current of a switching regulator operating in continuous current mode. At step 1122, compare the inductor current to a reference current level such as Imin, where Imin is the minimum output current before discontinuous current operation begins. Continuing to step 1124, determine a percentage of the switching period during which the inductor current is approximately less than or equal to the minimum output current. At step 1126, compare the switching period percentage to a reference percentage such as approximately 40%. At step 1128, switch to DCM if the duty cycle percentage exceeds the reference percentage. At step 1130, sense the regulated output voltage. At step 1132, shift the sensed regulated output voltage above a first voltage reference, V1. At step 1134, compare the shifted regulated output voltage to a second voltage reference, V2. Continuing to step 1136, if a portion of the shifted regulated voltage is less than or equal to V2, then the mode controller switches the mode to CCM.

Capture of State Information

Figure 36:
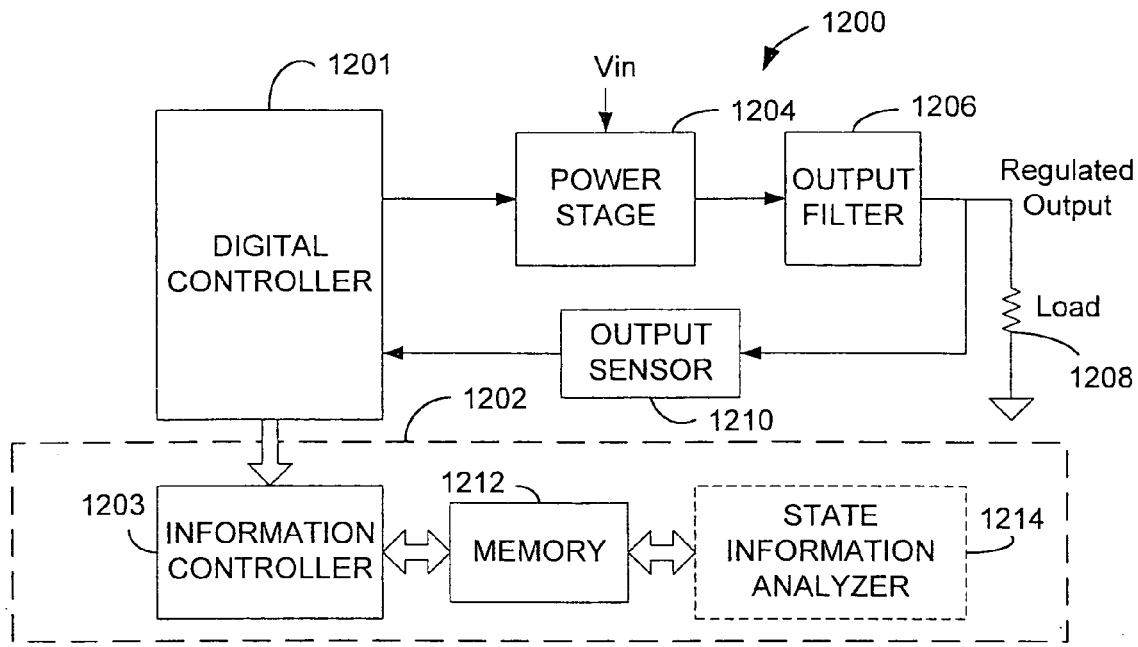
FIG. 36 is a block diagram of an aspect of a state information storage system for a digital controller.

FIG. 36 shows a storage system 1200 for capturing state information of a digital controller 1201 for an output regulator 1200. The output regulator 1200 may be any type of regulator including a switching regulator, linear regulator, current regulator, voltage regulator, and power regulator. The output regulator 1200 may include a power stage 1204 and output filter 1206 to convert energy from in input source to a regulated output for supplying energy to a load 1208. An output sensor 1210 may sense the regulated output and provide an input to the digital controller 1201.

The storage system 1200 may include an information controller 1203 to retrieve the state information. The information controller 1203 may advantageously capture any state information such as output voltage, output current, nominal duty cycle, adjusted duty cycle, power switch on-time, power switch off-time, input current, error voltage, delay control value, adjustment value, and all other digital values that are received or processed by the digital controller 1201 or output regulator 1200. P A memory 1212 may store the state information. Any type of memory may be employed such as static RAM, dynamic RAM, flash RAM, and content addressable RAM. The state information may be temporally organized in any manner including using a time stamp, sequentially storing information, and storing subsets of state information based on trigger events. The trigger events may be any type of event such as a state value exceeding a predetermined threshold, a predetermined time interval having elapsed, and combinations of multiple trigger events. The state information may be stored over any time interval duration such as short intervals that are a fraction of the switching period and long intervals extending for months and years.

A state information analyzer 1214 may analyze the stored state information. The state information analyzer 1214 may evaluate the stored state information to determine system and component operating conditions such as variations from normal operating ranges, component reliability estimates, and the necessity for component maintenance. The stored state information may be evaluated at predetermined time periods, randomly, and on an on-going basis. The state information analyzer 1214 may be permanently connected in communication with the storage system 1202 or be intermittently connected such as with a separate system used for evaluating the status of one or more output regulators.

A number of embodiments of the invention have been described. Nevertheless, it will be understood that various modifications may be made without departing from the spirit and scope of the invention. Accordingly, other embodiments are within the scope of the following claims.

What is claimed is:

1. A duty cycle estimator for determining a duty cycle for controlling a regulated output of an output regulator, the output regulator responsive to the duty cycle for controlling a transfer of energy between an input source and the regulated output, comprising:
   an error generator to compare the regulated output to an output reference to generate an output error;
   an accumulator to determine an accumulated error of the output error over a time period of at least N times a switching period of the output regulator, where N is an integer;
   a reference generator to generate reference levels; and
   a comparator to compare the accumulated error to the reference levels such that a single zero is generated, and to generate the duty cycle based on the comparing.

2. The duty cycle estimator of claim 1 wherein the accumulated error is selected from a group consisting of running error, average error, mean error, weighted average error, and combinations thereof.

3. The duty cycle estimator of claim 1 wherein N is at least approximately 1000.

4. The duty cycle estimator of claim 1 wherein the reference levels include at least a first reference level and a second reference level; and
   the comparator to compare the accumulated error to each of the reference levels and in response to control the duty cycle by steps.

5. The duty cycle estimator of claim 4 wherein each of the steps include a predetermined portion of the duty cycle in a range of approximately 0.1% of a maximum duty cycle to 5% of the maximum duty cycle.

6. The duty cycle estimator of claim 4 wherein if the accumulated error is less than the first reference level, the comparator to reduce the duty cycle by at least one step; and
   if the accumulated error is greater than the second reference level, the comparator to increase the duty cycle by at least one step.

7. The duty cycle estimator of claim 1 wherein the duty cycle corresponds to an on-time; and
   the output regulator has a variable switching frequency.

8. A duty cycle estimator for determining a duty cycle for controlling a regulated output of an output regulator, the output regulator responsive to the duty cycle for controlling a transfer of energy between an input source and the regulated output, comprising:
   means for error generating to compare the regulated output to an output reference to generate an output error;
   means for accumulating to determine an accumulated error of the output error over a time period of at least N times a switching period of the output regulator, where N is an integer;
   means for generating to generate reference levels; and
   means for comparing to compare the accumulated error to the reference levels such that a single zero is generated, and to generate the duty cycle based on the comparing.

9. The duty cycle estimator of claim 8 wherein the accumulated error is selected from a group consisting of running error, average error, mean error, weighted average error, and combinations thereof.

10. The duty cycle estimator of claim 8 wherein the time period is at least approximately 1000 times the switching period of the output regulator.

11. The duty cycle estimator of claim 8 wherein the reference levels include at least a first reference level and a second reference level; and
  the comparing means to compare the accumulated error to each of the reference levels and in response to control the duty cycle by steps.

12. The duty cycle estimator of claim 11 wherein each of the steps include a predetermined portion of the duty cycle in a range of approximately 0.1% of a maximum duty cycle to 5% of the maximum duty cycle.

13. The duty cycle estimator of claim 11 wherein if the accumulated error is less than the first reference level, the comparing means to reduce the duty cycle by at least one step; and
  if the accumulated error is greater than the second reference level, the comparing means to increase the duty cycle by at least one step.

14. The duty cycle estimator of claim 8 wherein the duty cycle corresponds to an on-time; and
  the output regulator has a variable switching frequency.

15. A method for determining a duty cycle for controlling a regulated output of an output regulator, the output regulator responsive to the duty cycle for controlling a transfer of energy between an input source and the regulated output, comprising:
  comparing the regulated output to an output reference to generate an output error;
  accumulating the output error over a time period of at least 100 times a switching period of the output regulator to determine an accumulated error;
  generating reference levels; and
  comparing the accumulated error to the reference levels such that a single zero is generated, and to generate the duty cycle based on the comparing.

16. The method of claim 15 wherein the accumulated error is selected from a group consisting of running error, average error, mean error, weighted average error, and combinations thereof.

17. The method of claim 15 wherein the time period is at least approximately 1000 times the switching period of the output regulator.

18. The method of claim 15 wherein the reference levels include at least a first reference level and a second reference level; and
  the comparing further includes comparing the accumulated error to each of the reference levels and in response controlling the duty cycle by steps.

19. The method of claim 18 wherein each of the steps include a predetermined portion of the duty cycle in a range of approximately 0.1% of a maximum duty cycle to 5% of the maximum duty cycle.

20. The method of claim 18 wherein if the accumulated error is less than the first reference level, then reducing the duty cycle by at least one step; and
  if the accumulated error is greater than the second reference level, then increasing the duty cycle by at least one step.

21. The method of claim 15 wherein the duty cycle corresponds to an on-time; and
  the output regulator has a variable switching frequency.

22. The duty cycle estimator of claim 1 wherein N is at least approximately 10.

23. The duty cycle estimator of claim 8 wherein N is at least approximately 10.

24. The duty cycle estimator of claim 1 wherein N is at least approximately 100.

25. The duty cycle estimator of claim 8 wherein N is at least approximately 100.

26. The duty cycle estimator of claim 1 included in the output regulator.

27. The duty cycle estimator of claim 8 included in the output regulator.

* * * * *

UNITED STATES PATENT AND TRADEMARK OFFICE
CERTIFICATE OF CORRECTION

PATENT NO. : 7,411,377 B2
APPLICATION NO. : 11/187761
DATED : August 12, 2008
INVENTOR(S) : Sehat Sutardja et al.

It is certified that error appears in the above-identified patent and that said Letters Patent is hereby corrected as shown below:

| | |
|---|---|
| Title Page 2, Column 1 | Under US References, page 2, 6,115, 266, Delete "Maeyama" and insert -- Matsui -- |
| Column 3, Line 37 | Delete "leveland" and insert -- level and -- |
| Column 3, Line 61 | Delete "dutycycle" and insert -- duty cycle -- |
| Column 5, Line 67 | Delete "." after "Cuk," |
| Column 6, Line 36 | Delete "anyjtopology" and insert -- any topology -- |
| Column 7, Line 64 | Insert -- are -- after "arrays" |
| Column 8, Line 5 | Delete "theclock" and insert -- the clock -- |
| Column 8, Line 30 | Delete "I/Oregulator" and insert -- I/O regulator -- |
| Column 10, Line 62 | Insert -- be -- after "may" |
| Column 13, Line 47 | Delete "the" after "devices" and insert -- may be used. The -- |
| Column 14, Line 61 | Delete "cycle-bycycle" and insert -- cycle-by-cycle -- |
| Column 16, Line 38 | Delete "on" and insert -- one -- |
| Column 18, Line 32 | Delete "Using" and insert -- using -- |
| Column 19, Line 54 | Delete "$V^{VI}$nripple" and insert -- $V_{in\text{-}ripple}$ -- |
| Column 20, Line 45 | Delete "-" between "corresponds" and "to" |
| Column 21, Line 44 | Delete "n" and insert -- In -- |
| Column 22, Line 18 | Delete "electricalcharacteristic" and insert -- electrical characteristic -- |
| Column 22, Line 21 | Delete the ";" after "current" and insert -- , -- |
| Column 23, Line 35 | Insert -- . -- after "$Up^*_{prior}$" |
| Column 25, Line 26 | Delete "in" and insert -- an -- |
| Column 25, Line 39 | Delete "P" after "1200" |

Signed and Sealed this

Twenty-fourth Day of February, 2009

JOHN DOLL
*Acting Director of the United States Patent and Trademark Office*